United States Patent
Choi

(10) Patent No.: US 9,054,105 B2
(45) Date of Patent: Jun. 9, 2015

(54) SEMICONDUCTOR PACKAGE AND METHOD FOR FABRICATING THE SAME

(71) Applicant: SAMSUNG ELECTRONICS CO., LTD., Suwon-si, Gyeonggi-do (KR)

(72) Inventor: Keun-Ho Choi, Asan-si (KR)

(73) Assignee: SAMSUNG ELECTRONICS CO., LTD., Suwon-si, Gyeonggi-do (KR)

( * ) Notice: Subject to any disclaimer, the term of this patent is extended or adjusted under 35 U.S.C. 154(b) by 0 days.

(21) Appl. No.: 13/934,485

(22) Filed: Jul. 3, 2013

(65) Prior Publication Data

US 2014/0008796 A1    Jan. 9, 2014

(30) Foreign Application Priority Data

Jul. 9, 2012 (KR) .................. 10-2012-0074540

(51) Int. Cl.
  *H01L 23/52* (2006.01)
  *H01L 23/522* (2006.01)
  *H01L 23/31* (2006.01)
  *H01L 23/498* (2006.01)
  *H01L 23/00* (2006.01)
  *H01L 25/065* (2006.01)

(52) U.S. Cl.
  CPC ........ *H01L 23/5221* (2013.01); *H01L 23/3128* (2013.01); *H01L 23/49811* (2013.01); *H01L 24/49* (2013.01); *H01L 2224/49113* (2013.01); *H01L 2224/4941* (2013.01); *H01L 2224/48091* (2013.01); *H01L 2224/73265* (2013.01); *H01L 2224/16225* (2013.01); *H01L 2224/32145* (2013.01); *H01L 25/0657* (2013.01); *H01L 2224/32225* (2013.01); *H01L 2224/48227* (2013.01); *H01L 2225/0651* (2013.01); *H01L 2225/1023* (2013.01); *H01L 2225/1058* (2013.01); *H01L 2924/15311* (2013.01); *H01L 2225/06506* (2013.01); *H01L 2225/06562* (2013.01); *H01L 2224/48148* (2013.01); *H01L 2224/131* (2013.01); *H01L 2224/16227* (2013.01)

(58) Field of Classification Search
  USPC .................................. 257/777, 780–782, 784
  See application file for complete search history.

(56) References Cited

U.S. PATENT DOCUMENTS

| | | | |
|---|---|---|---|
| 6,650,013 B2 | 11/2003 | Yin et al. | |
| 7,173,340 B2 * | 2/2007 | Zhou et al. | 257/777 |
| 7,655,552 B2 | 2/2010 | Gerber | |
| 7,723,852 B1 * | 5/2010 | Kim et al. | 257/777 |
| 2007/0069391 A1 | 3/2007 | Gritti | |
| 2007/0102801 A1 | 5/2007 | Ishida et al. | |
| 2008/0176358 A1 | 7/2008 | Liu et al. | |
| 2008/0230888 A1 | 9/2008 | Sasaki | |
| 2010/0237480 A1 | 9/2010 | Mii et al. | |

FOREIGN PATENT DOCUMENTS

| | | |
|---|---|---|
| JP | 2007-150144 A | 6/2007 |
| KR | 10-2002-0032175 A | 5/2002 |

* cited by examiner

*Primary Examiner* — Jasmine Clark
(74) *Attorney, Agent, or Firm* — Lee & Morse, P.C.

(57) ABSTRACT

A semiconductor package includes a mounting board including a bonding pad, first and second semiconductor chips sequentially stacked on the mounting board, a first wire connecting a first region of the bonding pad to a chip pad of the first semiconductor chip, and a second wire connecting the first region of the bonding pad to a chip pad of the second semiconductor chip, the second wire having a reverse loop configuration.

17 Claims, 22 Drawing Sheets

SEMICONDUCTOR PACKAGE AND METHOD FOR FABRICATING THE SAME

CROSS-REFERENCE TO RELATED APPLICATION

This application claims priority from Korean Patent Application No. 10-2012-0074540 filed on Jul. 9, 2012 in the Korean Intellectual Property Office, and all the benefits accruing therefrom under 35 U.S.C. 119, the contents of which in its entirety are herein incorporated by reference.

BACKGROUND

1. Field

Example embodiments relate to a semiconductor package and to a method for fabricating the same.

2. Description of the Related Art

Pursuant to the request for implementation of high-performance devices, the size of a semiconductor chip is gradually decreasing. In order to meet requirements of multi-function, high-capacity semiconductor package, development of a multi-chip semiconductor package having multiple semiconductor chips stacked in a package is under way.

However, according to the trend toward slimness of an electronic device incorporating the semiconductor package, the semiconductor package tends to shrink. To cope with the trend toward slimness of the electronic device, various studies of methods for downsizing the semiconductor package are being conducted.

In order to integrate multiple semiconductor chips into a semiconductor package, it is necessary to establish electrical connections among the semiconductor chips and/or between the semiconductor chips and a mounting. In order to establish the electrical connections, various methods, e.g., wires, may be used.

SUMMARY

Example embodiments provide a semiconductor package, which is reduced in size by performing double bonding on connection pads when electrically connecting a plurality of chips to the connection pads on a mounding board using wires.

Example embodiments also provide a method for fabricating a semiconductor package, which is reduced in size.

According to an aspect of the example embodiments, there is provided a semiconductor package including a mounting board including a bonding pad, first and second semiconductor chips sequentially stacked on the mounting board, a first wire connecting a first region of the bonding pad to a chip pad of the first semiconductor chip, and a second wire connecting the first region bonded to the first wire and a chip pad of the second semiconductor chip and having a reverse loop configuration.

The first wire may be connected to the bonding pad in a stitch configuration, and the second wire is connected to the bonding pad in a ball bonding configuration.

The semiconductor package may further include a bump ball between the first wire and the second wire on the first region.

At least a portion of the second wire may overlap the first region.

The first semiconductor chip may include a first upper semiconductor chip and a first lower semiconductor chip, and the first wire connects a chip pad of the first lower semiconductor chip to the bonding pad.

The second semiconductor chip may include a second upper semiconductor chip and a second lower semiconductor chip, and the second wire connects a chip pad of the second lower semiconductor chip to the bonding pad.

The semiconductor package may further include a third wire connecting the chip pad of the first lower semiconductor chip to the chip pad of the first upper semiconductor chip, and a fourth wire connecting the chip pad of the second lower semiconductor chip to the chip pad of the second upper semiconductor chip.

The semiconductor package may further include third and fourth semiconductor chips sequentially stacked on the second semiconductor chip, and third and fourth wires connecting the bonding pad to chip pads of the third and fourth semiconductor chips, respectively, wherein the third wire is bonded to the bonding pad in a second region of the bonding pad, and the fourth wire is bonded to the second region having the third wire bonded thereto and has a reverse loop configuration.

The third semiconductor chip may include a third upper semiconductor chip and a third lower semiconductor chip, the third wire connecting the chip pad of the third lower semiconductor chip to the bonding pad.

The fourth semiconductor chip may include a fourth upper semiconductor chip and a fourth lower semiconductor chip, the fourth wire connecting the chip of the fourth lower semiconductor chip to the bonding pad.

The semiconductor package may further include a fifth wire connecting the chip pad of the third lower semiconductor chip to the chip pad of the third upper semiconductor chip, and a sixth wire connecting the chip pad of the fourth lower semiconductor chip to the chip pad of the fourth upper semiconductor chip.

According to another aspect of the example embodiments, there is provided a semiconductor package including a mounting board including a first bonding pad and a second bonding pad disposed to be spaced apart from each other, first to fourth semiconductor chips sequentially stacked between the first and second bonding pads and including first to fourth chip pads, respectively, a first wire connecting a first region of the first bonding pad to the first chip pad, and a second wire connecting a second region of the second bonding pad to the second chip pad, a third wire connecting the first region having the first wire bonded thereto to the third chip pad and having a reverse loop configuration, and a fourth wire connecting the second region having the second wire bonded thereto to the fourth chip pad and having a reverse loop configuration.

The semiconductor package may further include a bump ball on at least one of a portion between the first wire and the third wire on the first region, and a portion between the second wire and the fourth wire on the second region.

The first and second wires may be connected to the first and second bonding pads in a stitch configuration, respectively, the third and fourth wires being connected to the first and second bonding pads in a ball bonding configuration, respectively.

The semiconductor package may further include fifth to eighth semiconductor chips sequentially stacked on the fourth semiconductor chip and including fifth to eighth chip pads, wherein a third region of the first bonding pad is connected to the fifth chip pad by a fifth wire, a fourth region of the second bonding pad is connected to the sixth chip pad by a sixth wire, the third region having the fifth wire bonded thereto is connected to a seventh chip pad by a seventh wire having a reverse loop configuration, and the fourth region having the seventh wire bonded thereto is connected to an eighth chip pad by an eighth wire having a reverse loop configuration.

According to another aspect of the example embodiments, there is provided a semiconductor package including a mounting board including a bonding pad, first and second semiconductor chips sequentially stacked on the mounting board, a first wire connecting a first region of the bonding pad to a chip pad of the first semiconductor chip, and a second wire connecting the first region of the bonding pad to a chip pad of the second semiconductor chip, the second wire being connected to the first region through the first wire.

The first wire may define a first connection region in the first region of the bonding pad, and the second wire may define a second connection region in the first region of the bonding pad, the first and second connection regions at least partially overlap each other.

A portion of the second connection region may directly contact the bonding pad.

The entire second connection region may contact the bonding pad only through the first connection region.

Centers of the first and second connections regions may not overlap.

BRIEF DESCRIPTION OF THE DRAWINGS

Features will become apparent to those of ordinary skill in the art by describing in detail exemplary embodiments with reference to the attached drawings, in which.

DETAILED DESCRIPTION

Figure 1A:
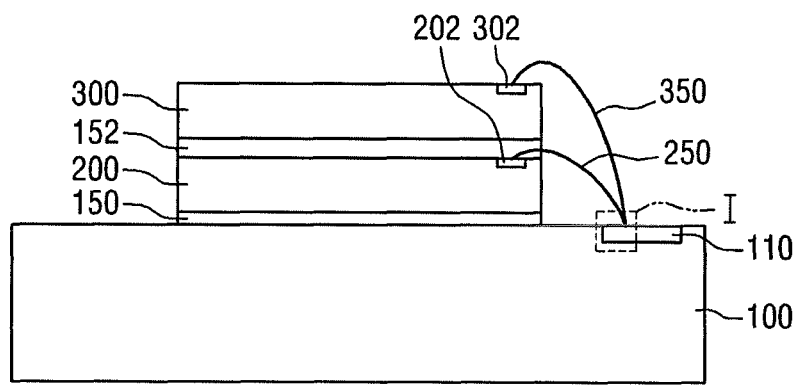
FIGS. 1A and 1B illustrate side views of a semiconductor package according to an embodiment.

Example embodiments will now be described more fully hereinafter with reference to the accompanying drawings, in which preferred embodiments are shown. The example embodiments may, however, be embodied in different forms and should not be construed as limited to the embodiments set forth herein. Rather, these embodiments are provided so that this disclosure will be thorough and complete, and will fully convey their scope to those skilled in the art. The same reference numbers indicate the same components throughout the specification. In the attached figures, the thickness of layers and regions may be exaggerated for clarity.

It will be understood that when an element or layer is referred to as being "connected to" or "coupled to" another element or layer, it can be directly connected to or coupled to another element or layer or intervening elements or layers may be present. In contrast, when an element is referred to as being "directly connected to" or "directly coupled to" another element or layer, there are no intervening elements or layers present. It will also be understood that when a layer is referred to as being "on" another layer or substrate, it can be directly on the other layer or substrate, or intervening layers may also be present. In contrast, when an element is referred to as being "directly on" another element, there are no intervening elements present. As used herein, the term "and/or" includes any and all combinations of one or more of the associated listed items.

It will be understood that, although the terms first, second, etc. may be used herein to describe various elements, these elements should not be limited by these terms. These terms are only used to distinguish one element from another element. Thus, for example, a first element, a first component or a first section discussed below could be termed a second element, a second component or a second section without departing from the teachings of the example embodiments.

The use of the terms "a" and "an" and "the" and similar referents in the context of describing the invention (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted.

Unless defined otherwise, all technical and scientific terms used herein have the same meaning as commonly understood by one of ordinary skill in the art to which this invention belongs. It is noted that the use of any and all examples, or exemplary terms provided herein is intended merely to better illuminate the invention and is not a limitation on the scope of the invention unless otherwise specified. Further, unless defined otherwise, all terms defined in generally used dictionaries may not be overly interpreted.

Hereinafter, a semiconductor package according to an embodiment will be described with reference to FIGS. 1A to 3B.

Figure 1B:
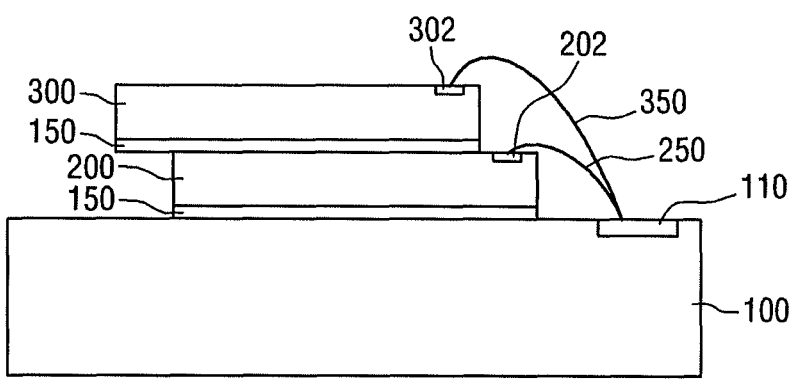
Figure 2:
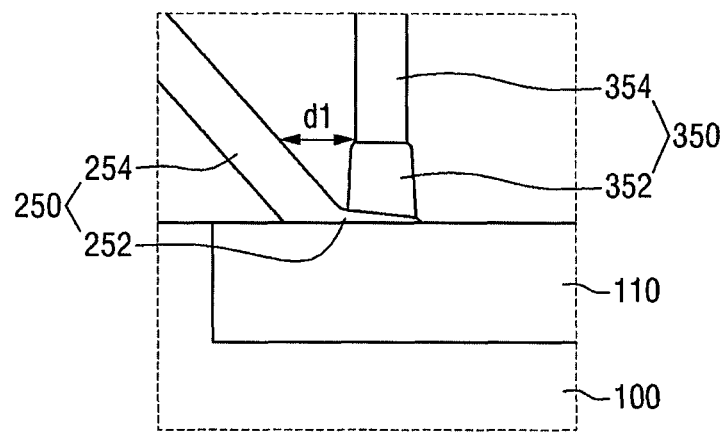
FIG. 2 illustrates an enlarged side view of portion "I" in FIG. 1A.
Figure 3A:
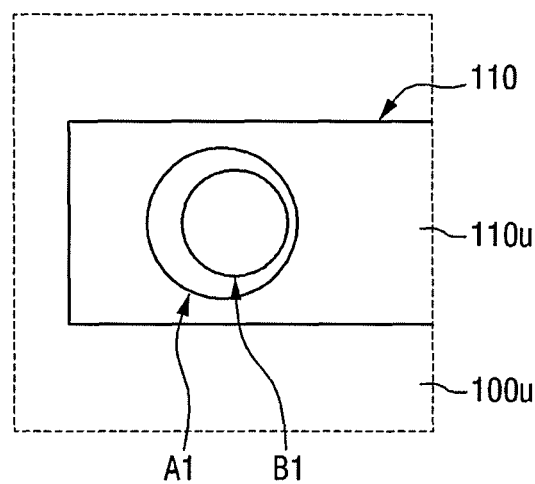
FIGS. 3A and 3B illustrate enlarged plan views of a top portion of a bonding pad in portion "I" in FIG. 1A.
Figure 3B:
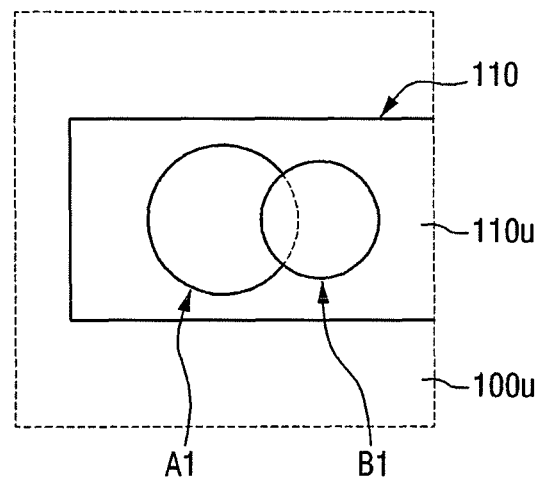

FIGS. 1A and 1B are side views of a semiconductor package according to an embodiment, FIG. 2 is an enlarged side view of portion "I" of FIG. 1A, and FIGS. 3A and 3B are enlarged plan views of a top portion of a bonding pad in portion "I".

First, referring to FIGS. 1A and 1B, a semiconductor package 10 may include a mounting board 100, a first semiconductor chip 200, a second semiconductor chip 300, a first wire 250, and a second wire 350. The mounting board 100 may include a first bonding pad 110 on a surface on which the first semiconductor chip 200 and the second semiconductor chip 300 are disposed. The first semiconductor chip 200 and the second semiconductor chip 300 are sequentially mounted on the mounting board 100 and include a first chip pad 202 and a second chip pad 302, respectively. The first wire 250 may electrically connect the first bonding pad 110 and the first chip pad 202, and may be bonded to a first region (A1 of FIG. 3A) of the first bonding pad 110. The second wire 350 may electrically connect the first bonding pad 110 to the second chip pad 302, and may be bonded to the first region of the first bonding pad 110. In other words, the first wire 250 and the second wire 350 are double bonded in the first region of the first bonding pad 110, e.g., the first region may be a double bonded region having two bonding regions of two different wires at least partially overlap on the bonding pad 110. The second wire 350 may be, e.g., a reverse loop wire.

In detail, the mounting board 100 may be a board for packaging, e.g., a printed circuit board (PCB) or a ceramic substrate. An external terminal (not shown) electrically connecting the semiconductor package to an external device may be formed on a bottom surface of the mounting board 100, i.e., a mounting surface on which the semiconductor chips 200 and 300 are disposed. The first bonding pad 110 may be electrically connected to the external terminal connected to the external device, and may supply an electrical signal to the semiconductor chip 200 and 300. Alternatively, the first bonding pad 110 may be, e.g., a ground pad, and may be electrically connected to a ground line (not shown) in the mounting board 100. In the illustrated embodiment, the first bonding pad 110 is disposed on, e.g., a peripheral portion of the mounting board 100, but aspects of the example embodiments are not limited thereto.

The first semiconductor chip 200 and the second semiconductor chip 300 may be, e.g., memory chips, logic chips, or the like. When the first semiconductor chip 200 and/or the second semiconductor chip 300 are logic chips, they may be designed in various manners in consideration of the operation to be executed. When the first semiconductor chip 200 and/or the second semiconductor chip 300 are memory chips, the memory chips may be, e.g., non-volatile memory chips. For example, the memory chip 100 may be a flash memory chip, e.g., a NAND flash memory chip or a NOR flash memory chip, but the example embodiments are not limited to the above. In some embodiments, the memory chip 100 may include at least one of a phase change random access memory (PRAM), a magneto-resistive random access memory (MRAM), a resistive random access memory (RRAM), and so on.

The first chip pad 202 of the first semiconductor chip 200 and the second chip pad 302 of the second semiconductor chip 300 are electrically connected to semiconductor devices incorporated in the first semiconductor chip 200 and the second semiconductor chip 300, respectively. Therefore, since the first chip pad 202 and the second chip pad 302 are electrically connected to the first bonding pad 110, they may perform a same function in the respective semiconductor devices.

The first semiconductor chip 200 and the mounting board 100 may be attached by a first adhesive film 150, and the first semiconductor chip 200 and the second semiconductor chip 300 may be attached by a second adhesive film 152. The first and second adhesive films 150 and 152 may be, e.g., die attach films (DAFs) or adhesive films into which a wire can penetrate. The first and second adhesive films 150 and 152 may have different thicknesses according to locations to which the first and second adhesive films 150 and 152 are attached. The adhesive films into which a wire can penetrate, e.g., the second adhesive film 152 into which the first wire 250 can penetrate, may be thicker than the first adhesive film 150 so as to protect the second wire 350. Here, "the wire penetrating into an adhesive film" means that even if an adhesive film is provided, the wire is surrounded by the adhesive film and its shape is maintained without being changed.

The first wire 250 and the second wire 350 may be made of a metal material, e.g., gold, copper, or aluminum. The first wire 250 and the second wire 350 may be connected to the first bonding pad 110 by, e.g., a heat compression method, an ultrasonic method, etc., but not limited thereto.

When wire bonding starts from a chip pad of a semiconductor chip, the wire is formed by forward bonding and is a forward loop wire. On the contrary, when wire bonding terminates at a chip pad of a semiconductor chip, the wire is formed by forward bonding and is a reverse loop wire. In the following description of the semiconductor package according to the example embodiments, the first wire 250 may be, e.g., a forward or reverse loop wire. However, the second wire 350 may be, e.g., a reverse loop wire, which allows a clearance between the first wire 250 and the second wire 350 to be secured. In other words, when a plurality of wires, e.g., two wires, are overlapped with each other at the same region of the first bonding pad 110 to perform double bonding thereon, the later formed second wire 350 should have a reverse loop configuration to secure a clearance between the same and the earlier formed first wire 250.

Referring to FIGS. 1A and 1B, exemplary methods of stacking the semiconductor package 10 according to an embodiment are illustrated. It is assumed that the first semiconductor chip 200 and the second semiconductor chip 300 have the same width. In the semiconductor package 10 shown in FIG. 1A, the second semiconductor chip 300 is disposed to overlap the first semiconductor chip 200. Therefore, the semiconductor package 10 may have, e.g., a linear lateral profile. In addition, the first wire 250 may be configured to penetrate into the second adhesive film 152 in view of the lateral profile. In the semiconductor package 10 shown in FIG. 1B, the second semiconductor chip 300 is disposed to partially overlap the first semiconductor chip 200. Therefore, the semiconductor package 10 may have, e.g., a stepwise lateral profile.

Referring to FIG. 2, the first wire 250 is bonded to the first bonding pad 110. The second wire 350 is bonded to the bonded first wire 250. The first wire 250 is bonded to the first bonding pad 110 in a stitch configuration, for example. However, the second wire 350 is bonded to the first wire 250, i.e., to the first bonding pad 110, in a ball bonding configuration, for example.

The first wire 250 connecting the first chip pad 202 and a first region (A1 of FIG. 3A) of the first bonding pad 110 may be formed by forward bonding. Here, the first wire 250 may have a stitch part 252 having a wedge shape and a first wire body 254. The stitch part 252 is a part that is actually bonded to the first bonding pad 110 and has a thickness that gradually decreases as a horizontal distance from the first wire body 254 increases.

The second wire 350 connecting the second chip pad 302 and the first region of the first bonding pad 110 may be formed by reverse bonding. Here, the second wire 350 may have a ball part 352 having a ball shape and a second wire body 354. For example, the ball part 352 disposed on the stitch part 252 may be a part formed by a capillary used in wire bonding. Since the second wire 350 starts from the stitch part 252 of the first bonding pad 110, the ball part 352 may be formed in the second wire 350.

Referring to FIG. 2, an angle formed by the first wire 250 and the mounting board 100 may be smaller than an angle formed by the second wire 350 and the mounting board 100, which is for the purpose of securing a clearance between the first wire 250 and the second wire 350. A distance between the first wire body 254 and the second wire body 354 may be indicated by d1, which increases as an angle formed by the first wire 250 and the second wire 350 increases. In addition, as a size of the ball part 352 of the second wire 350 increases, d1 may increase. The clearance between the first wire 250 and the second wire 350 may be adjusted by controlling the processing condition.

Referring to FIGS. 3A and 3B, an upper surface 110u of the first bonding pad 110 may be bonded to the first wire 250 at a region A1, and may be bonded to the second wire 350 at a region B1. Since the second wire 350 is formed after the first wire 250 is bonded to the first bonding pad 110, the region B1 may be a region formed on the region A1. In the illustrated embodiment, the regions A1 and B1 are circular, which is only for brevity of explanation, but aspects of the example embodiments are not limited thereto.

For example, referring to FIG. 3A, the region B1 having the second wire 350 bonded thereto is positioned at the region A1 having the first wire 250 bonded thereto, i.e., the region B1 may be completely overlapped by the region A1. This means that the second wire 350 is only bonded, e.g., directly bonded, to the first wire 250, i.e., the second wire 350 is not directly bonded to the first bonding pad 110. That is to say, the second wire 350 is electrically connected to the first bonding pad 110 through the first wire 250. Since it is necessary for the second wire 350 to be bonded on the stitch part 252 of the first wire 250 shown in FIG. 2, a center of the region B1 having the second wire 350 bonded thereto is separated from the center of the region A1 having the first wire 250 bonded thereto. In other words, while portions of the regions A1 and B1 may overlap, centers of the regions A1 and B1 may not overlap. However, the stitch part 252 of the first wire 250 may be configured in various manners according to the processing condition in bonding the first wire 250 to the first bonding pad 110, but aspects of the example embodiments are not limited thereto.

In another example, referring to FIG. 3B, a portion of the region B1 having the second wire 350 bonded thereto overlaps the region A1 having the first wire 250 bonded thereto, i.e., only a portion of the second wire 350 overlaps the region A1 having the first wire 250 bonded thereto. Therefore, region B1 having the second wire 350 bonded thereto may include a first portion bonded to the first bonding pad 110 through the first wire 250 and a second portion directly bonded to the first bonding pad 110. Here, even if the region B1 having the second wire 350 bonded thereto only partially overlaps the region A1 having the first wire 250 bonded thereto, the first wire 250 and the second wire 350 are double bonded on the first bonding pad 110.

A modified example of the semiconductor package according to an embodiment will now be described with reference to FIG. 4. Since the modified example is substantially the same as the previous embodiment, except that the semiconductor package further includes a bump ball, the same functional components are denoted by the same reference numerals and the description thereof will be made briefly or omitted.

Figure 4:
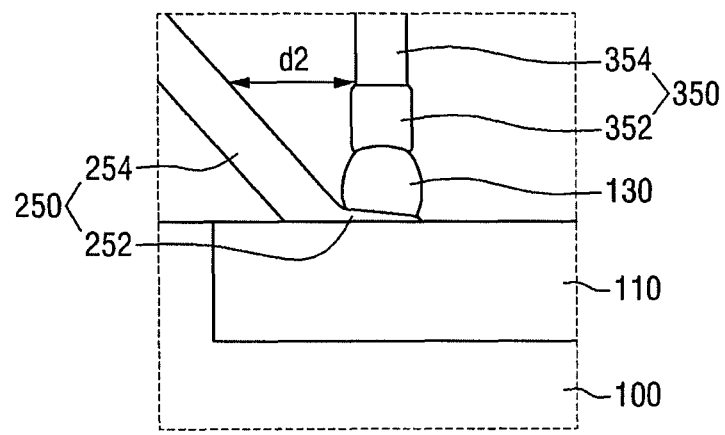
FIG. 4 illustrates an enlarged plan view of a bonding pad for explaining a modified example of the semiconductor package according to an embodiment.

FIG. 4 is an enlarged plan view of a bonding pad for explaining a modified example of the semiconductor package according to an embodiment.

Referring to FIG. 4, the first wire 250 is bonded on the first bonding pad 110. The second wire 350 is bonded on the bonded first wire 250. A bump ball 130 may be disposed between the first wire 250 and the second wire 350. A plurality of bump balls 130 may be disposed between the first wire 250 and the second wire 350. In the illustrated embodiment, only one bump ball 130 is shown, which is only for brevity of explanation, but aspects of the example embodiments are not limited thereto. For example, the first wire 250 is connected, e.g., directly, to the first bonding pad 110 in a stitch configuration, and the second wire 350 is connected to the first wire 250, i.e., the second wire 350 is connected to the first bonding pad 110 through the bump ball 130 and first wire 250 in a ball bonding configuration. In other words, the bump ball 130 is disposed between the first wire stitch part 252 and the second wire ball part 352 of the second wire 350.

For example, the bump ball 130 may be made of the same material as the second wire 350. The bump ball 130 may be formed before forming the second wire 350 or may be formed by a capillary used in wire bonding. Referring to FIG. 4, the bump ball 130 may be used to adjust a clearance between the first wire 250 and the second wire 350. When the bump ball 130 is provided, a distance between the first wire body 254 and the second wire body 354 may be d2, which may be different from d1 of FIG. 2 in which the bump ball 130 is not provided. Assuming that processing conditions for forming the first wire 250 and the second wire 350 are the same, an angle formed by the first wire 250 and the second wire 350 with respect to the first wire stitch part 252 may be the same as the angle of FIG. 2. The bump ball 130 is disposed on the stitch part 252, and the second wire ball part 352 is disposed on the bump ball 130. A distance between the second wire ball part 352 and the stitch part 252 may differ depending on the presence or absence of the bump ball 130. Since a length of a chord increases away from the center of a fan-shaped sector, the distance d2 with the bump ball 130 is greater than the distance d2 without the bump ball 130, which is because a starting point of the second wire 350 becomes farther from the first wire stitch part 252 by the bump ball 130. The clearance between the first wire 250 and the second wire 350 can be easily obtained by adjusting the number of bump balls 130 disposed between the first wire 250 and the second wire 350 on the first bonding pad 110.

Figure 5A:
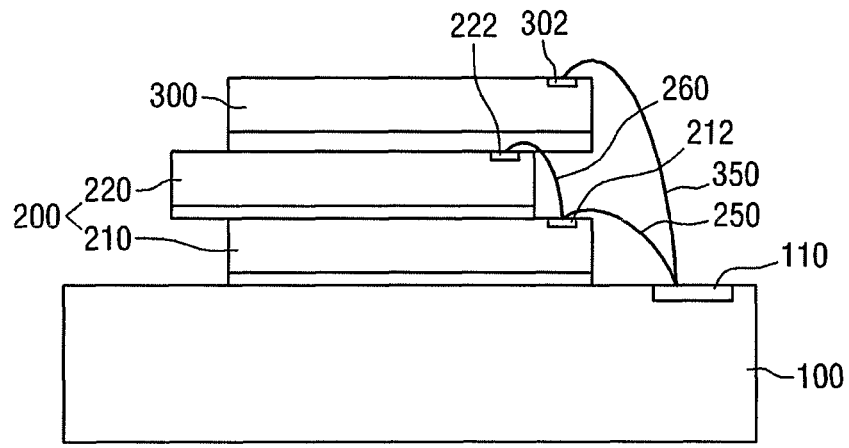
FIGS. 5A to 5C illustrate side views of a semiconductor package according to another embodiment.
Figure 5B:
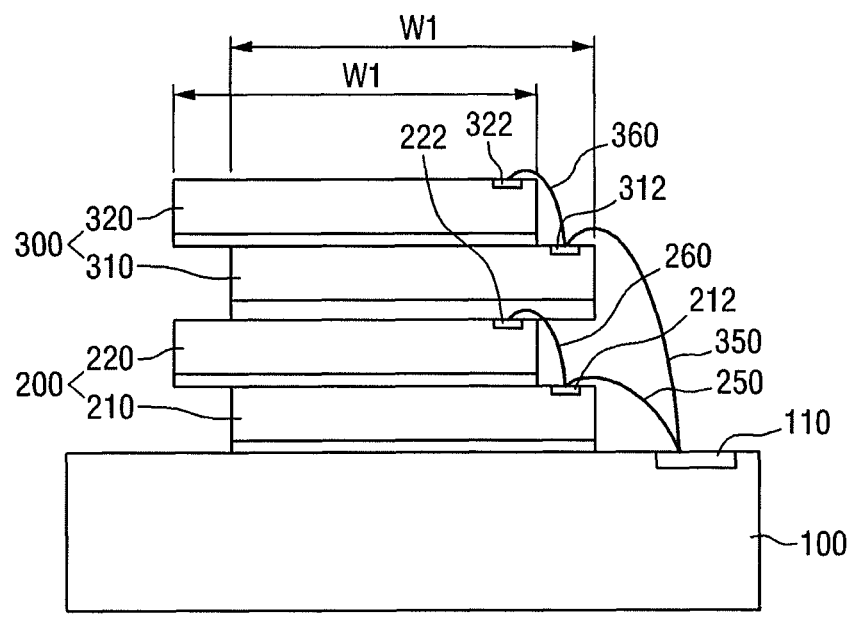
Figure 5C:
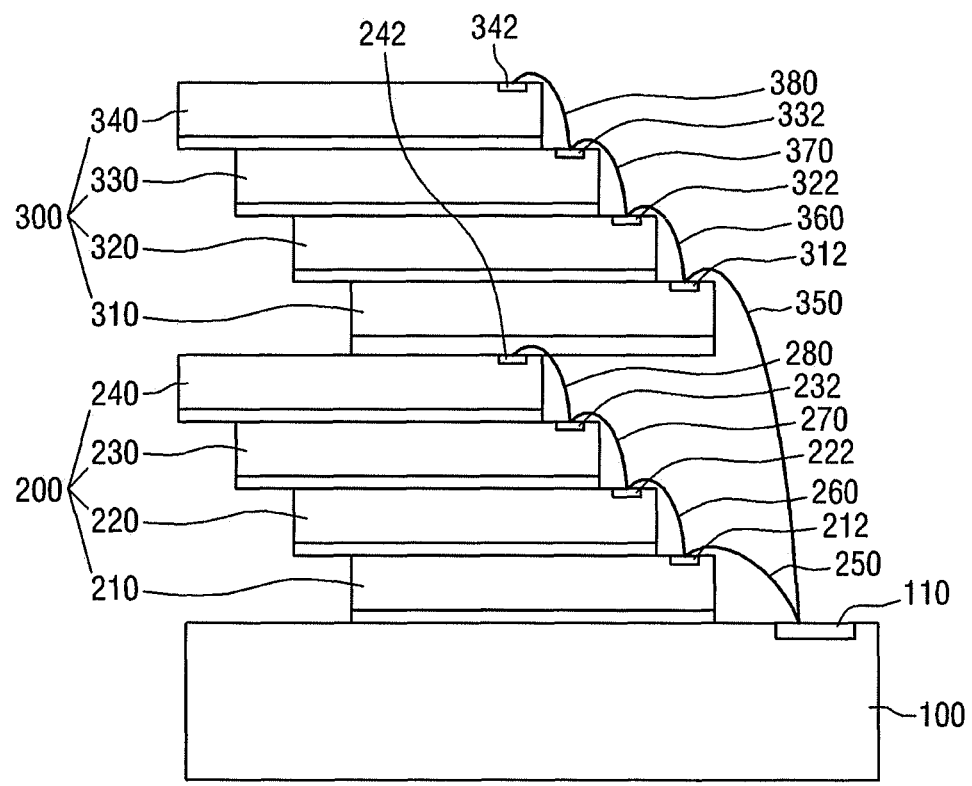
Figure 6A:
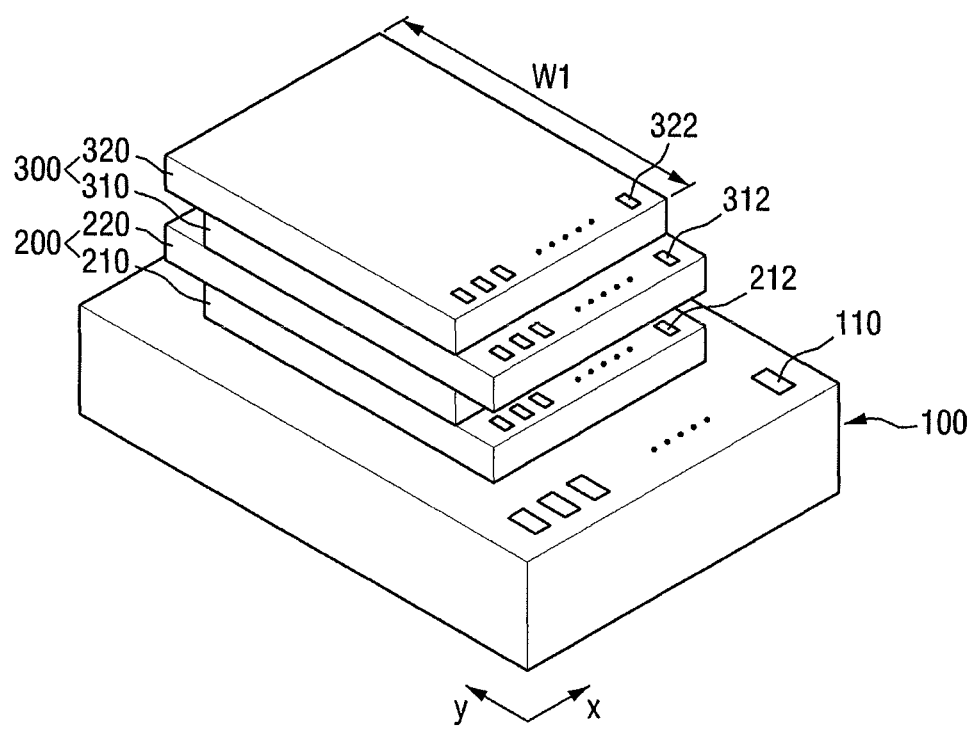
FIGS. 6A and 6B illustrate views of exemplary stacked configurations of semiconductor chips for implementing a semiconductor package of FIG. 5B, except for wires.
Figure 6B:
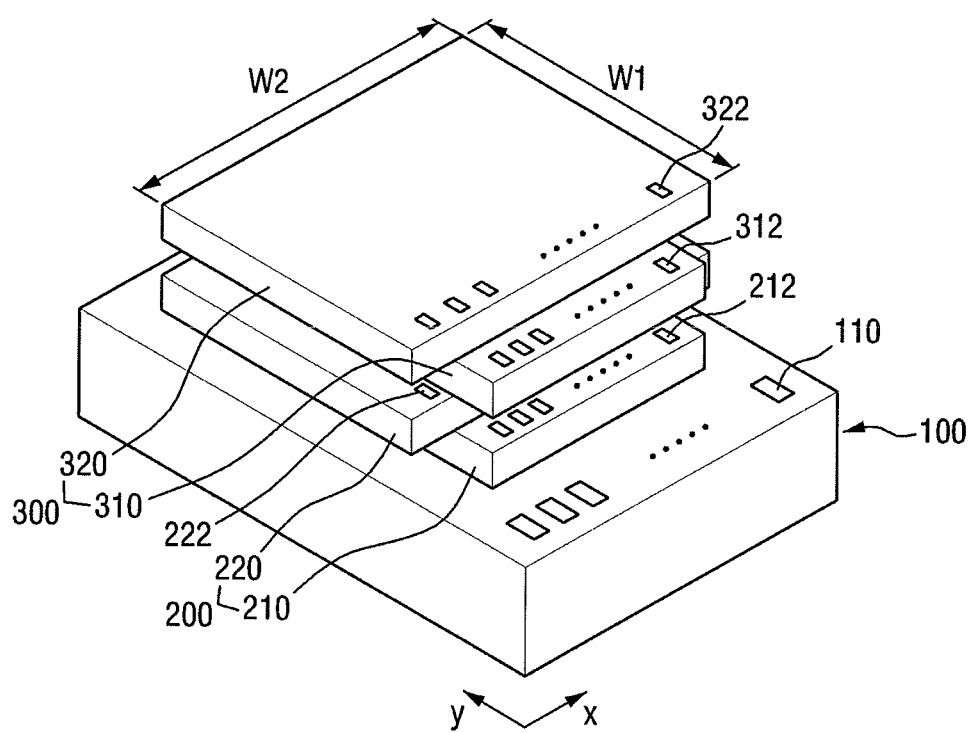

Semiconductor packages according to other embodiments will be described with reference to FIGS. 5A to 6B. FIGS. 5A to 5C are side views of a semiconductor package according to another embodiment, and FIGS. 6A and 6B are views illustrating exemplary stacks of semiconductor chips for implementing a semiconductor package of FIG. 5B, except for wires.

Referring to FIG. 5A, a first semiconductor chip 200 may include a first upper semiconductor chip 220 and a first lower semiconductor chip 210. In other words, the first semiconductor chip 200 may be a multi-chip having a plurality of chips, but the second semiconductor chip 300 may be a single chip. The first lower semiconductor chip 210 and the first upper semiconductor chip 220 may be sequentially stacked on the mounting board 100, and the second semiconductor chip 300 may further be stacked thereon. A chip pad 222 of the first upper semiconductor chip 220 and a chip pad 212 of the first lower semiconductor chip 210 may be connected to each other by a first inter-chip wire 260. The first wire 250 may connect a first region (A1 of FIG. 3) of the first bonding pad 110 to the chip pad 212 of the first lower semiconductor chip 210. The second wire 350 electrically connects the first bonding pad 110 and the second chip pad 302 and is bonded to the first region of the first bonding pad 110 having the first wire 250 bonded thereto. The second wire 350 is a reverse loop wire.

Referring to FIG. 5B, the first semiconductor chip 200 may include the first upper semiconductor chip 220 and the first lower semiconductor chip 210. The second semiconductor chip 300 may include a second upper semiconductor chip 320 and a second lower semiconductor chip 310. That is to say, each of the first semiconductor chip 200 and the second semiconductor chip 300 may be a multi-chip having a plurality of chips. The first lower semiconductor chip 210, the first upper semiconductor chip 220, the second lower semiconductor chip 310, and the second upper semiconductor chip 320 are sequentially stacked on the mounting board 100. The chip pad 222 of the first upper semiconductor chip 220 and the chip pad 212 of the first lower semiconductor chip 210 may be connected to each other by the first inter-chip wire 260. A chip pad 322 of the second upper semiconductor chip 320 and a chip pad 312 of the second lower semiconductor chip 310 may be connected to each other by a second inter-chip wire 360. The first wire 250 connects a first region of the first bonding pad 110 to the chip pad 212 of the first lower semiconductor chip 210. The second wire 350 having a reverse loop configuration connects the first region of the first bonding pad 110 having the first wire 250 bonded thereto to the chip pad 312 of the second lower semiconductor chip 310, thereby establishing double bonding.

It is assumed that all of the first lower semiconductor chip 210, the first upper semiconductor chip 220, the second lower semiconductor chip 310, and the second upper semiconductor chip 320 have the same width. As shown in FIG. 5B, the first semiconductor chip 200 and the second semiconductor chip 300 are stacked to have a zigzag lateral profile, in which projections and depressions are periodically formed, but aspects of the example embodiments are not limited thereto. That is to say, the stacked first and second semiconductor chips 200 and 300 may have, for example, a stepwise lateral profile. Here, even if the sequentially stacked semiconductor chips have different sizes, they may be stacked in a zigzag configuration.

In order to ensure wire bonding efficiency, the first wire 250 and the second wire 350 may connect chip pads 212 and 312 of semiconductor chips 210 and 310 protruding toward the first bonding pad 110, among semiconductor chips included in the semiconductor package 12, to the first bonding pad 110, respectively.

Referring to FIG. 5C, a semiconductor package 13 may include the first semiconductor chip 200 and the second semiconductor chip 300, each being a multi-chip including a plurality of semiconductor chips. The semiconductor package 13 is substantially the same as the semiconductor package 12 shown in FIG. 5B, except for the number of semiconductor chips forming each of the first semiconductor chip 200 and the second semiconductor chip 300. A chip pad 212 of a first lower semiconductor chip closest to the first bonding pad 110 and the first bonding pad 110 may be connected by the first wire 250, and a chip pad 312 of a second lower semiconductor chip closest to the first bonding pad 110 and the first bonding pad 110 may be connected by the second wire 350. The plurality of semiconductor chips forming each of the first semiconductor chip 200 and the second semiconductor chip 300 may be stacked stepwise, but aspects of the example embodiments are not limited thereto.

FIGS. 6A and 6B illustrate exemplary stacked configurations of semiconductor chips for implementing the semiconductor package 12 of FIG. 5B. The first lower semiconductor chip 210, the first upper semiconductor chip 220, the second lower semiconductor chip 310, and the second upper semiconductor chip 320 are sequentially stacked on the mounting board 100.

Referring to FIG. 6A, chip pads 212, 312, and 322 of semiconductor chips 210, 220, 310, and 320 are arranged in a first direction x, and the first bonding pad 110 is also arranged in the first direction x. Assuming the semiconductor chips 210, 220, 310, and 320 have a width, e.g., w1, edges of the semiconductor chips 210, 220, 310, and 320 stacked on the mounting board 100 may be arranged in a staggered manner in a second direction y in a zigzag configuration. However, edges of the semiconductor chips 210, 220, 310, and 320 not arranged in a staggered manner may be aligned toward a normal line of the mounting board 100, but aspects of the example embodiments are not limited thereto. Edges of the semiconductor chips 210, 220, 310, and 320 stacked on the mounting board 100 may be arranged in a staggered manner in at least two directions x and y.

Referring to FIG. 6B, each of the semiconductor chips 210, 220, 310, and 320 may have, e.g., a rectangular plane shape. A length of one side of the rectangular plane may be w1 and a length of the other side may be w2. The sequentially stacked semiconductor chips 210, 220, 310, and 320 may be arranged in a rotated state of an angle of 90 degrees. Chip pads 212 and 312 of a first lower semiconductor chip 210 and a second lower semiconductor chip 310 may be arranged along one of edges of the rectangle having the length w1. On the contrary, the chip pads 212 and 312 of a first upper semiconductor chip 220 and a second upper semiconductor chip 320 may be arranged along one of edges of the rectangle having the length w2. However, the chip pads 212, 222, 312, and 322 of the semiconductor chips 210, 220, 310, and 320 are arranged in the first direction x and a first bonding pad 110 is also arranged in the first direction x.

Figure 7A:
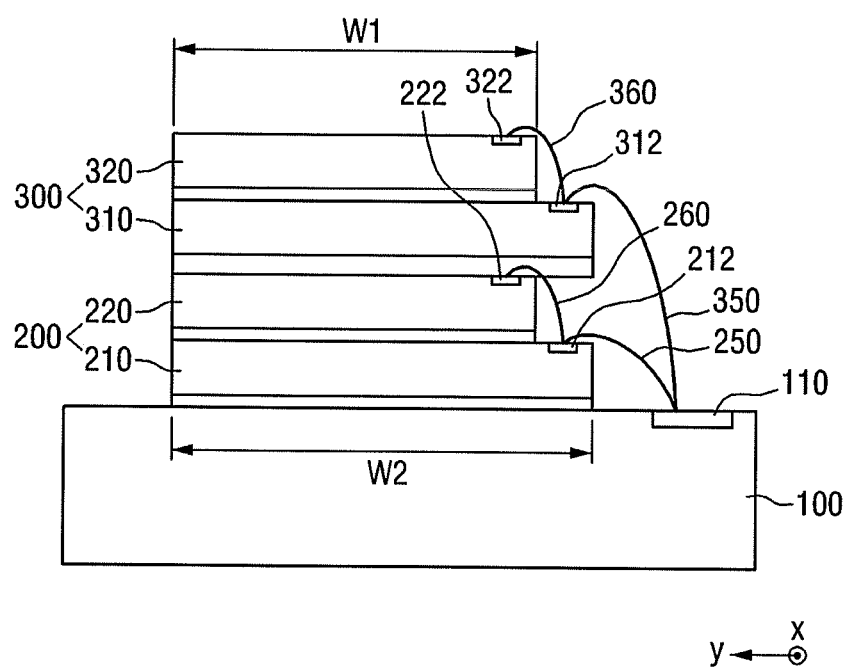
FIG. 7A illustrates a side view of a modified example of FIG. 5B.

A modified example of the semiconductor package according to another embodiment of the example embodiments will be described with reference to FIGS. 7A and 7B. FIG. 7A is a side view illustrating a modified example of FIG. 5B, and FIG. 7B is a view illustrating an exemplary stacked configuration of semiconductor chips for implementing a semiconductor package of FIG. 7A, except for wires.

Referring to FIG. 7A, the first lower semiconductor chip 210 and the second lower semiconductor chip 310 may have a width w2 in the second direction y, and a first upper semiconductor chip 220 and a second upper semiconductor chip 320 may have a width w1 in the second direction y. One of lateral surfaces of the stacked first and second semiconductor chips 200 and 300, which is adjacent to a first bonding pad 110, may have, e.g., a zigzag configuration. However, at least one lateral surfaces of the stacked first and second semiconductor chips 200 and 300, which is not adjacent to a first bonding pad 110, may be arranged in a line.

Figure 7B:
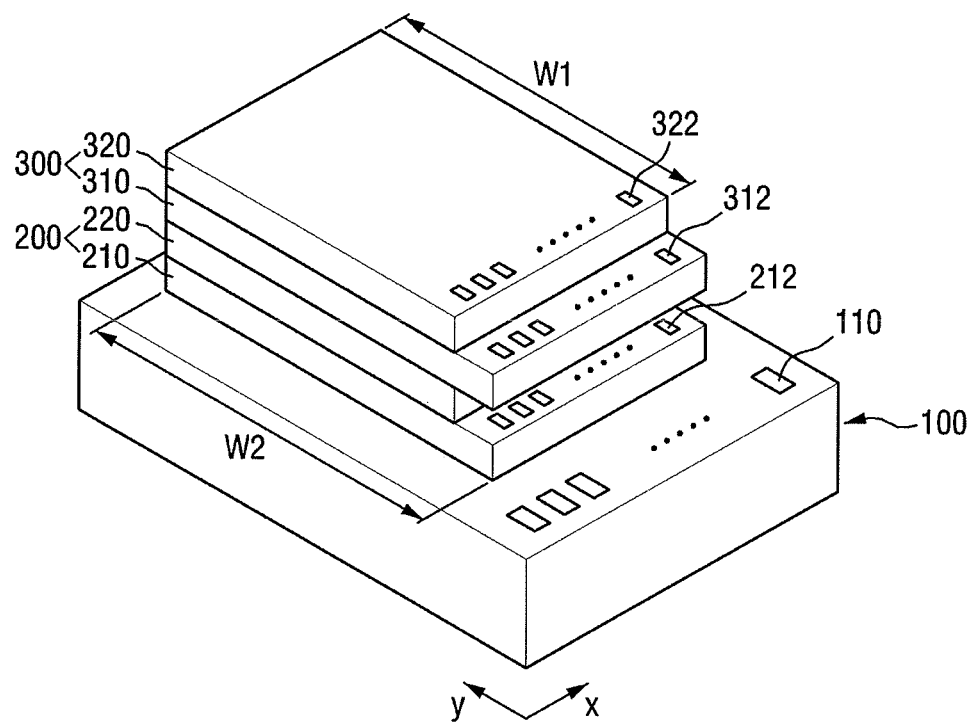
FIG. 7B illustrates a view of an exemplary stacked configuration of semiconductor chips for implementing a semiconductor package of FIG. 7A, except for wires.

Referring to FIG. 7B, edges of the semiconductor chips 210, 220, 310, and 320 having chip pads arranged in a line may have the same width. Alternatively, the edges of the semiconductor chips 210, 220, 310, and 320 having chip pads arranged in a line may have different widths.

Figure 8:
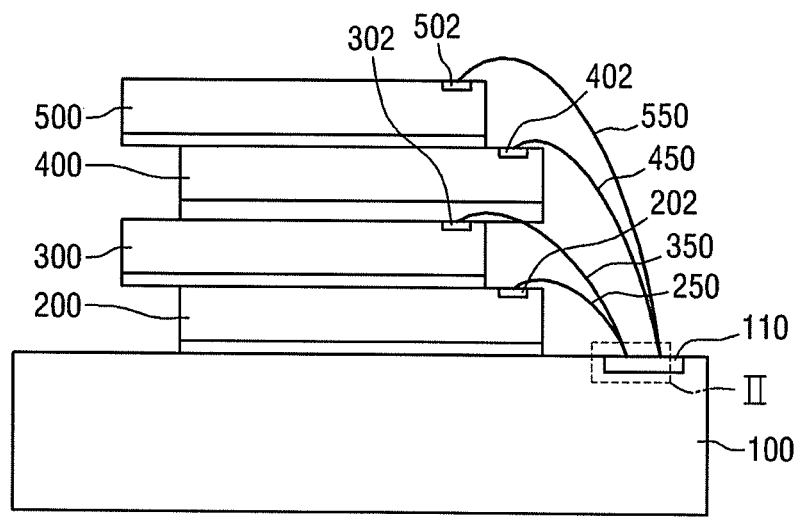
FIG. 8 illustrates a side view of a semiconductor package according to still another embodiment.

A semiconductor package according to still another embodiment will be described with reference to FIGS. 8 to 9B. FIG. 8 is a side view of a semiconductor package according to still another embodiment, and FIGS. 9A and 9B are enlarged plan views of a top portion of a bonding pad in portion "I" of FIG. 1A.

Referring to FIG. 8, a semiconductor package 15 includes first to fourth semiconductor chips 200, 300, 400, and 500 sequentially stacked on the mounting board 100. The semiconductor package 15 may further include first to fourth wires 250, 350, 450, and 550 connecting the first bonding pad 110 to first to fourth chip pads 202, 302, 402,b and 502. The first wire 250 is bonded to a first region (A1 of FIG. 9A) of the first bonding pad 110 and connects the first bonding pad 110 to the first chip pad 202. The second wire 350 is bonded to the first region having the first wire 250 bonded thereto and connects the first bonding pad 110 to the second chip pad 302. The third wire 450 is bonded to a second region (A2 of FIG. 2) of the first bonding pad 110 and connects the first bonding pad 110 to the third chip pad 402. The fourth wire 550 is bonded to the second region having the third wire 450 bonded thereto and connects the first bonding pad 110 to the fourth chip pad 502. In other words, the first wire 250 and the second wire 350 are double bonded in the first region of the first bonding pad 110, and the third wire 450 and the fourth wire 550 are double bonded in the second region of the first bonding pad 110. The second wire 350 and the fourth wire 550 may be, e.g., a reverse loop wire.

Referring to FIG. 8, the first to fourth semiconductor chips 200, 300, 400, and 500 may be stacked to have a zigzag lateral profile. The first to fourth semiconductor chips 200, 300, 400, and 500 may have the same width, but aspects of the example embodiments are not limited thereto.

Figure 9A:
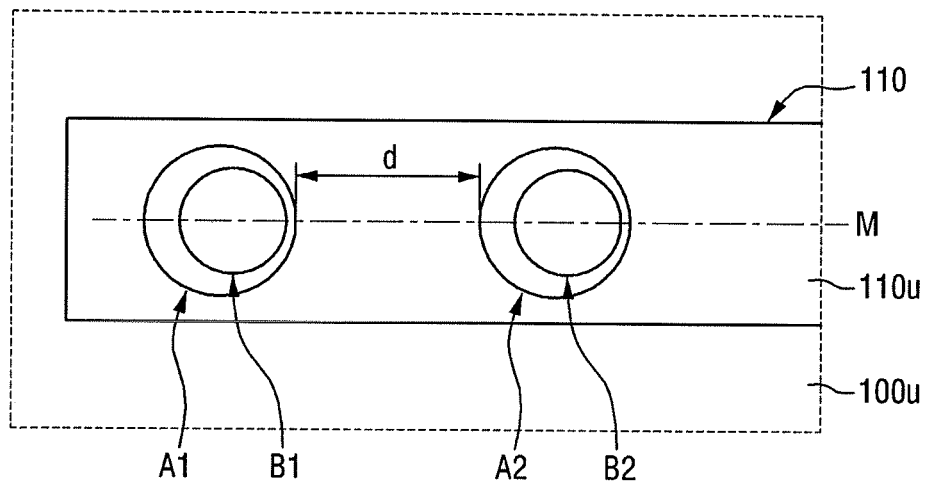
FIGS. 9A and 9B illustrate enlarged plan views of a top portion of a bonding pad in portion "II" of FIG. 1A.
Figure 9B:
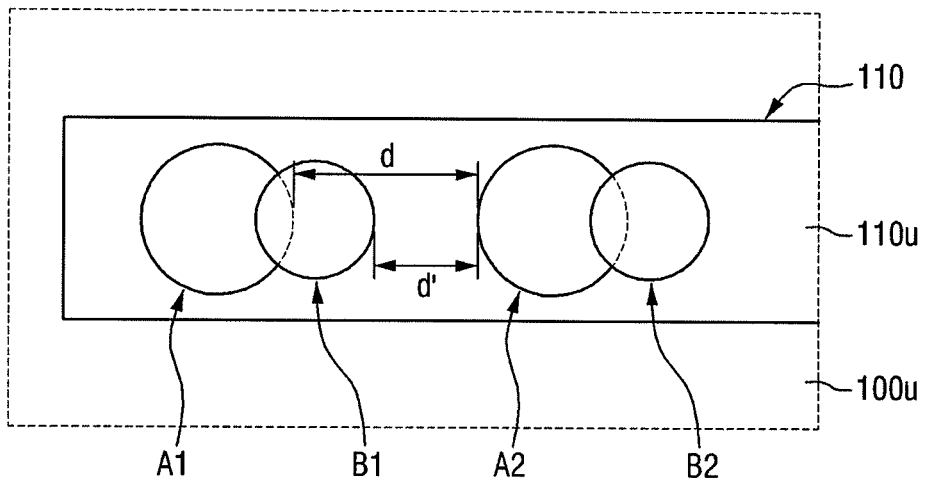

Referring to FIGS. 9A and 9B, the upper surface 110u of the first bonding pad 110 is bonded to the first wire 250 at the first region A1, and the upper surface 110u of the first bonding pad 110 is bonded to the second wire 350 at the region B1. The upper surface 110u of the first bonding pad 110 is bonded to the third wire 450 at the second region A2, and the upper surface 110u of the first bonding pad 110 is bonded to the fourth wire 550 at the region B2. The first region A1, having the first wire 250 bonded thereto, and the second region A2 may be spaced apart from each other, and a distance therebetween may be "d".

Referring to FIG. 9A, the region B1, where the first wire 250 and the second wire 350 are double bonded, and the region B2, where the third wire 450 and the fourth wire 550 are double bonded, may be positioned on a center line M of the bonding pad 110. However, example embodiments are not limited thereto, e.g., the regions A1, A2, B1, and B2 may have different orientations.

Referring to FIG. 9B, a potion of the second wire 350 may overlap the first region A1 and a portion of the fourth wire 550 may overlap the second region A2. Here, the first region A1 and the second region A2 are spaced apart from each other by the distance d. However, a distance between the double bonded region between the first wire 250 and the second wire 350 and the double bonded region between the third wire 450 and the fourth wire 550 may be d'. Here, d' and d may be different from each other, and in some cases, d' may be 0. When d' is 0, the first to fourth wires 250, 350, 450, and 550 may be physically in contact with each other.

Figure 10A:
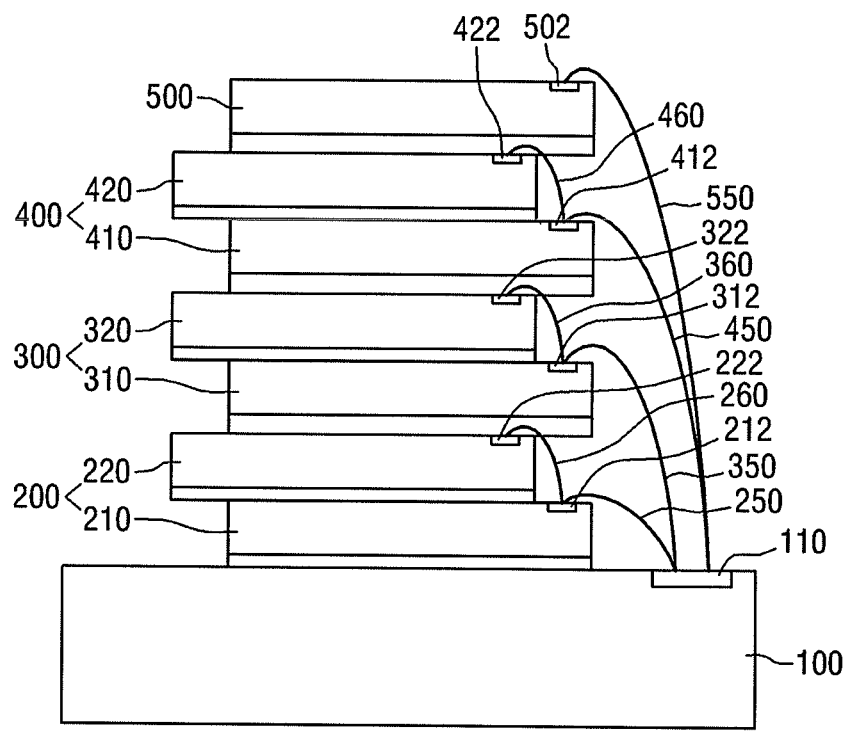
FIGS. 10A and 10B illustrate side views of a semiconductor package according to still another embodiment.
Figure 10B:
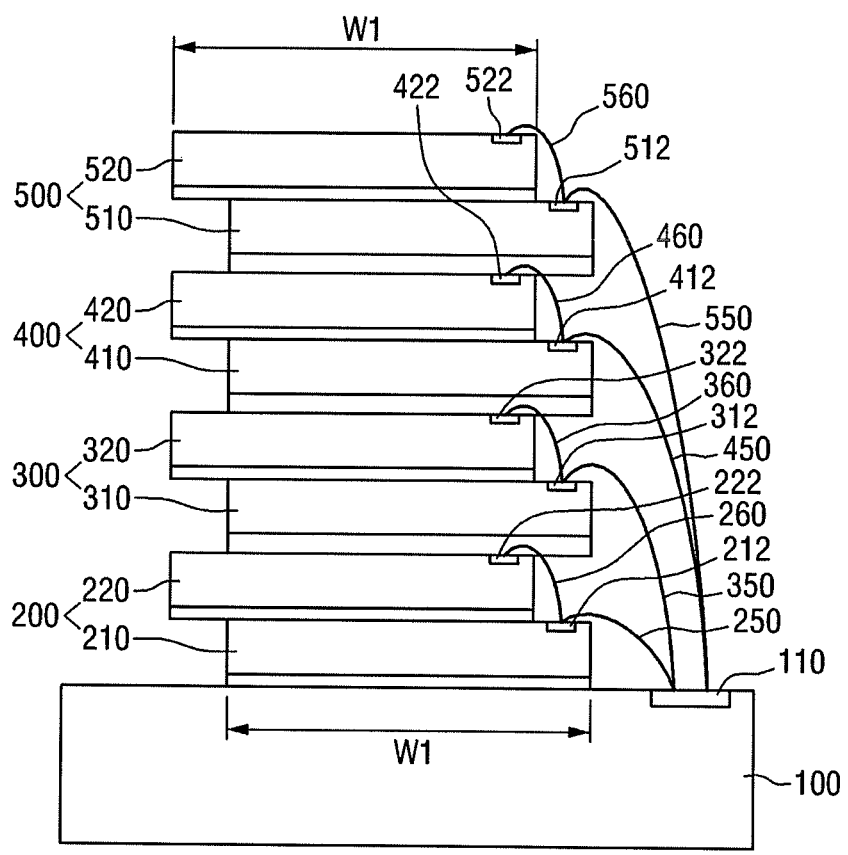

A semiconductor package according to still another embodiment will be described with reference to FIGS. 10A and 10B. In the following description, the semiconductor package shown in FIGS. 10A and 10B will be described assuming that the third semiconductor chip and the fourth semiconductor chip shown in FIG. 5B are stacked. FIGS. 10A and 10B are side views of a semiconductor package according to still another embodiment.

Referring to FIG. 10A, a third semiconductor chip 400 may be a multi-chip including a third upper semiconductor chip 420 and a third lower semiconductor chip 410, and a fourth semiconductor chip 500 may be a single chip. The third lower semiconductor chip 410, the third upper semiconductor chip 420, and the fourth semiconductor chip 500 are sequentially stacked on the second upper semiconductor chip 320. A chip pad 422 of the third upper semiconductor chip 420 and a chip pad 412 of the third lower semiconductor chip 410 may be connected by a third inter-chip wire 460. A third wire 450 may connect a second region (A2 of FIG. 9A) of the first bonding pad 110 to the chip pad 412 of the third lower semiconductor chip 410. A fourth wire 550 may electrically connect the first bonding pad 110 to a fourth chip pad 502 and may be bonded to the second region of the first bonding pad 110 having the third wire 450 bonded thereto. The second wire 350 may be a reverse loop wire.

Referring to FIG. 10B, the third semiconductor chip 400 may include a third upper semiconductor chip 420 and a third lower semiconductor chip 410, and the fourth semiconductor chip 500 may include a fourth upper semiconductor chip 520 and a fourth lower semiconductor chip 510. The chip pad 422 of the third upper semiconductor chip 420 and the chip pad 412 of the third lower semiconductor chip 410 may be connected by the third inter-chip wire 460, and a chip pad 522 of the fourth upper semiconductor chip 520 and a chip pad 512 of the fourth lower semiconductor chip 510 may be connected by a fourth inter-chip wire 560. The third wire 450 connects the second region of the first bonding pad 110 to the chip pad 412 of the third lower semiconductor chip 410. The fourth wire 550 having a reverse loop configuration connects the second region of the first bonding pad 110 having the third wire 450 bonded thereto to the chip pad 312 of the second lower semiconductor chip 310, thereby establishing double bonding.

The third lower semiconductor chip 410, the third upper semiconductor chip 420, the fourth lower semiconductor chip 510, and the fourth upper semiconductor chip 520 sequentially stacked on the second upper semiconductor chip 320 may have the same widths. As shown in FIG. 10B, the first to fourth semiconductor chips 200, 300, 400, and 500 are stacked to have a zigzag lateral profile in which projections and depressions are periodically formed, but aspects of the example embodiments are not limited thereto.

A semiconductor package according to still another embodiments will be described with reference to FIGS. 11 to 12B.

Figure 11:
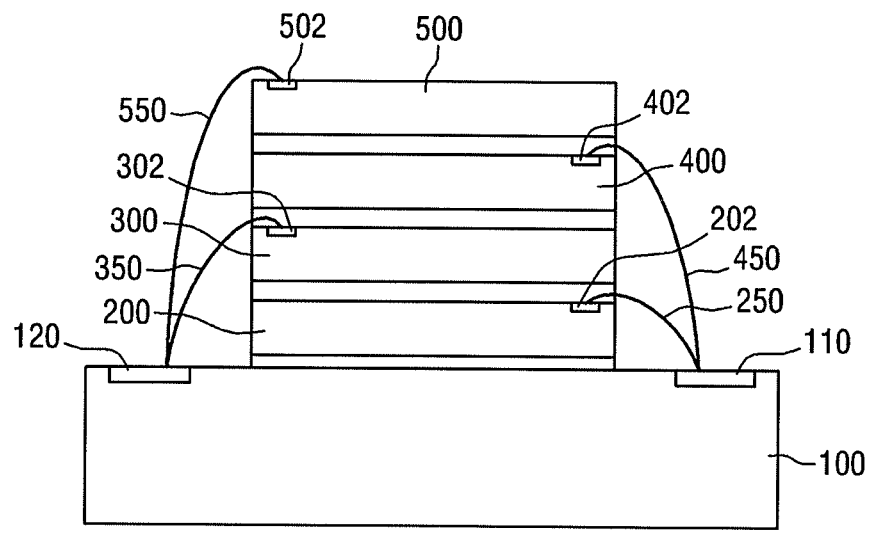
FIG. 11 illustrates a side view of a semiconductor package according to still another embodiment.
Figure 12A:
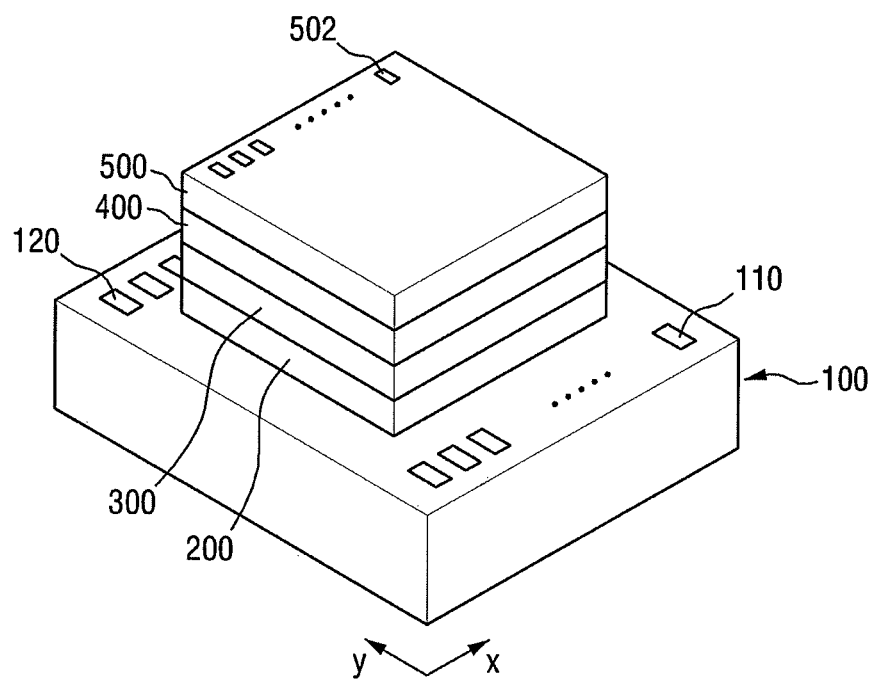
FIGS. 12A and 12B illustrate mounting boards to be used in the semiconductor package shown in FIG. 11.
Figure 12B:
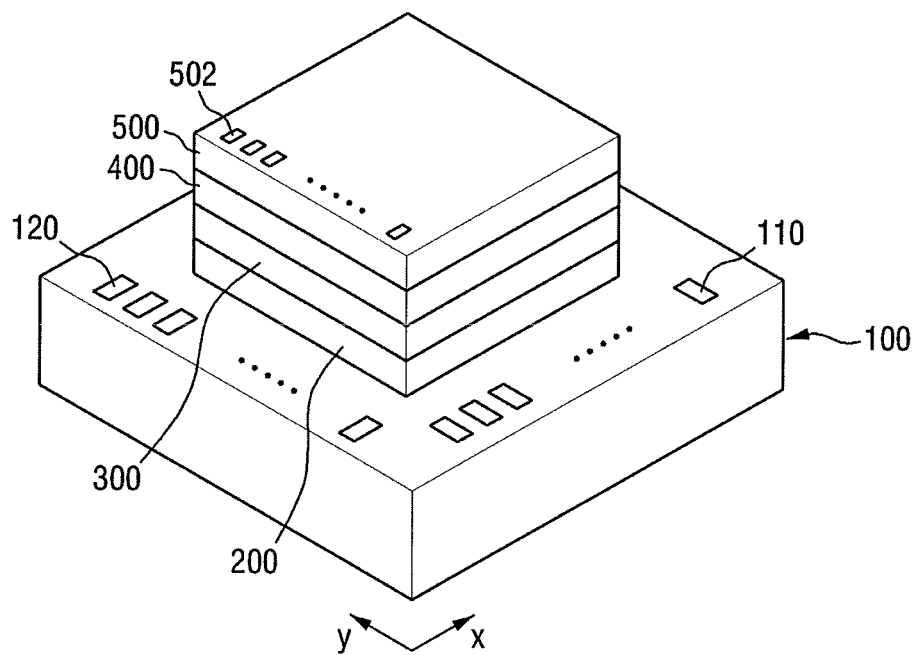

FIG. 11 is a side view of a semiconductor package according to still another embodiment, and FIGS. 12A and 12B illustrate mounting boards to be used in the semiconductor package shown in FIG. 11.

Referring to FIG. 11, a semiconductor package 18 may include a mounting board 100, first to fourth semiconductor chips 200, 300, 400, and 500, and first to fourth wires 250, 350, 450, and 550. In detail, the mounting board 100 may include the first bonding pad 110 and the second bonding pad 120. The first bonding pad 110 and the second bonding pad 120 may be disposed to be spaced apart from each other. For example, the first bonding pad 110 and the second bonding pad 120 may be disposed at facing edges on the mounting board 100, but aspects of the example embodiments are not limited thereto.

The sequentially stacked first to fourth semiconductor chips 200, 300, 400, and 500 may be disposed between the first bonding pad 110 and the second bonding pad 120. The first to fourth semiconductor chips 200, 300, 400, and 500 may include first to fourth chip pads 202, 302, 402, and 502, respectively. For example, the first chip pad 202 and the third chip pad 402 included in the first and third semiconductor chips 200 and 400 may be disposed at edges adjacent to the first bonding pad 110, and the second chip pad 302 and the fourth chip pad 502 included in the second and fourth semiconductor chips 300 and 500 may be disposed at edges adjacent to the second bonding pad 120, which is, however, provided only for illustration of the semiconductor package according to the example embodiments, but aspects of the example embodiments are not limited thereto.

In the illustrated embodiment, the sequentially stacked first to fourth semiconductor chips 200, 300, 400, and 500 have the same width and are stacked in a line, but aspects of the example embodiments are not limited thereto.

The first wire 250 electrically connects the first bonding pad 110 to the first chip pad 202 and is bonded to a first region (A1 of FIG. 14) of the first bonding pad 110. The second wire 350 electrically connects the second bonding pad 120 to the second chip pad 302 and is bonded to a third region (A3 of FIG. 14) of the second bonding pad 120. The third wire 450 may connect the first region having the first wire 250 bonded thereto to the third chip pad 402, thereby electrically connecting the third chip pad 402 and the first bonding pad 110. The fourth wire 550 may connect the third region having the second wire 350 bonded thereto to the fourth chip pad 502, thereby electrically connecting the fourth chip pad 502 to the second bonding pad 120. The third wire 450 bonded to the first region of the first bonding pad 110 and the fourth wire 550 bonded to the third region of the second bonding pad 120 may be, for example, a reverse loop wire. In addition, the first wire 250 and the third wire 450 may be double bonded in the first bonding pad 110, and the second wire 350 and the fourth wire 550 may be double bonded in the second bonding pad 120.

The semiconductor package 18 may further include the bump ball 130, as shown in FIG. 4, disposed between the first wire 250 and the second wire 350, which are double bonded in the first region of the first bonding pad 110. In addition, the semiconductor package 18 may further include a bump ball disposed between the second wire 350 and the fourth wire 550, which are double bonded in the third region of the second bonding pad 120. That is to say, the semiconductor package 18 may further bump balls between the first wire 250 and the second wire 350 on the first region of the first bonding pad 110 and/or between the second wire 350 and the fourth wire 550 on the third region of the second bonding pad 120.

Referring to FIGS. 2 and 1, the first wire 250 and the second wire 350 may be bonded to the first bonding pad 110 and the second bonding pad 120 in a stitch configuration, respectively, to be connected. The third wire 450 and the fourth wire 550 may be bonded to the first bonding pad 110 and the second bonding pad 120 in a ball bonding configuration, respectively, to be connected.

Referring to FIG. 12A, the first bonding pad 110 and the second bonding pad 120 may be disposed at facing edges on the mounting board 100, but aspects of the example embodiments are not limited thereto. The first bonding pad 110 and the second bonding pad 120 may be arranged in the first direction x. The first to fourth chip pads 202, 302, 402 and 502 may also be arranged in the first direction x. The first chip pad 202 and the third chip pad 402 may be arranged at edges of the semiconductor chip, which is adjacent to the first bonding pad 110, and the second chip pad 302 and the fourth chip pad 502 may be arranged at edges of the semiconductor chip, which is adjacent to the second bonding pad 120.

Referring to FIG. 12B, the first bonding pad 110 disposed at one edge of the mounting board 100 may be arranged in the first direction x. The second bonding pad 120 disposed at the other edge of the mounting board 100 adjacent to the edge where the first bonding pad 110 is disposed may be arranged in the second direction y. The direction in which the first to fourth chip pads connected to the first bonding pad 110 and the second bonding pad 120 are arranged may be determined by the direction in which the first bonding pad 110 and the second bonding pad 120 are arranged.

A semiconductor package according to still another embodiment will be described with reference to FIGS. 13 and 14. In the following description, the semiconductor package shown in FIG. 13 will be described assuming that the fifth to eighth semiconductor chips shown in FIG. 11 are stacked.

Figure 13:
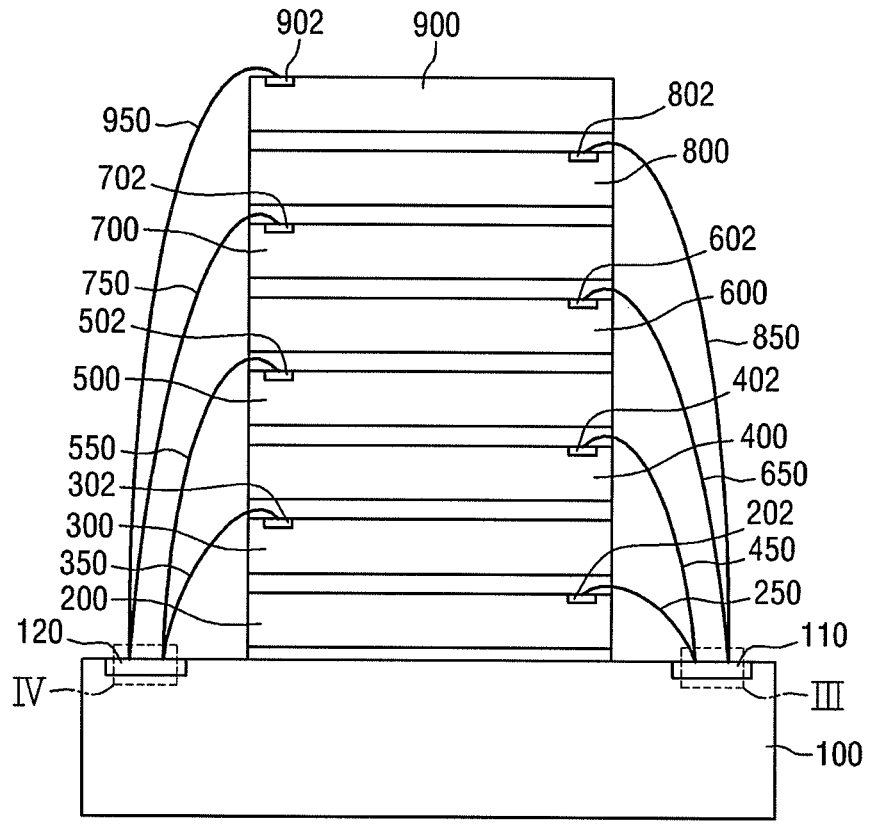
FIG. 13 illustrates a side view of a semiconductor package according to still another embodiment.

FIG. 13 is a side view of a semiconductor package according to still another embodiment. FIG. 14 is an enlarged plan view illustrating top portions of bonding pads in "III" and "IV" portions of FIG. 13.

Referring to FIG. 13, a semiconductor package 19 may include fifth to eighth semiconductor chips 600, 700, 800, and 900. The fifth to eighth semiconductor chips 600, 700, 800, and 900 are sequentially stacked on a fourth semiconductor chip 500 and may be arranged in a line, but aspects of the example embodiments are not limited thereto. A fifth chip pad 602 and a seventh chip pad 802 may be disposed at edges of the semiconductor chip adjacent to the first bonding pad 110, and a sixth chip pad 702 and an eighth chip pad 902 may be disposed at edges of the semiconductor chip adjacent to a second bonding pad 120.

The fifth wire 650 connects a second region (A2 of FIG. 14) of the first bonding pad 110 to the first chip pad 202, and the sixth wire 750 connects a fourth region (A4 of FIG. 14) of the second bonding pad to the sixth chip pad 702. A seventh wire 850 having a reverse loop configuration connects the second region having the fifth wire 650 bonded thereto to the seventh chip pad 802, and an eighth wire 950 having a reverse loop configuration connects the fourth region having the sixth wire 750 bonded thereto to the eighth chip pad 902.

The first wire 250 and the third wire 450, and the fifth wire 650 and the seventh wire 850 are double bonded, respectively, on the first bonding pad 110. In addition, the second wire 350 and the fourth wire 550, and the sixth wire 750 and the eighth wire 950 are double bonded, respectively, on the second bonding pad 120.

Figure 14:
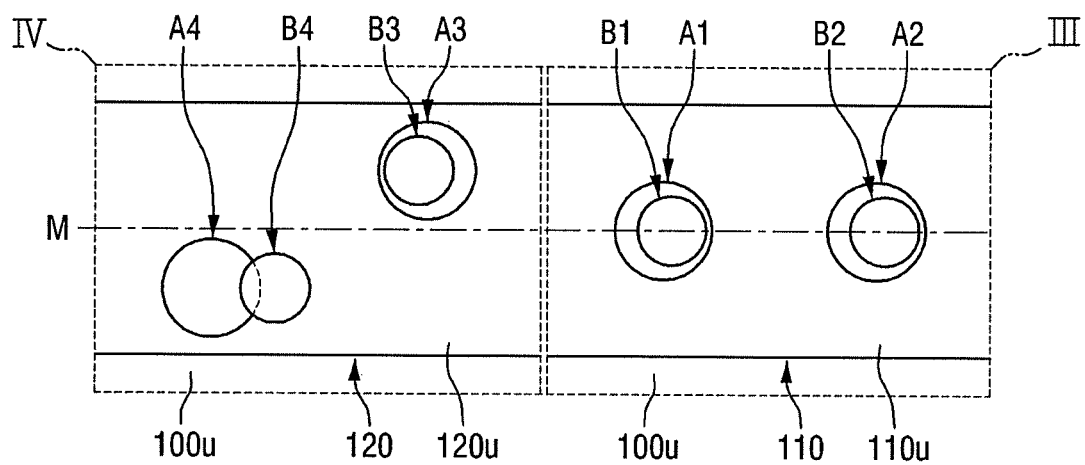
FIG. 14 illustrates an enlarged plan view of top portions of bonding pads in portions "III" and "IV" of FIG. 13.

Referring to FIG. 14, the first region A1 where the first wire 250 is bonded to the first bonding pad 110 and the second region A2 where the fifth wire 650 is bonded to the first bonding pad 110 may be spaced apart from each other. In addition, the third region A3 where the second wire 350 is bonded to the second bonding pad 120 and the fourth region A4 where the sixth wire 650 is bonded to the second bonding pad 120 may be spaced apart from each other.

Like two types of double bonding established in the first bonding pad 110, the double bonded regions B1 and B2 may be positioned on the center line M of the first bonding pad 110, respectively. However, like two types of double bonding established in the second bonding pad 120, the double bonded regions B3 and B4 may be spaced apart from the center line M of the second bonding pad 120, respectively.

In addition, like in the first bonding pad 110, the third wire 450 and the seventh wire 850 may completely overlap the first region A1 and the second region A2. However, like in the second bonding pad 120, only one of the third wire 450 and the seventh wire 850 may completely overlap the first region A1 and the second region A2, and the other may partially overlap the first region A1 and the second region A2.

A package-on-package (POP) structure including a semiconductor packages according to embodiments will be described with reference to FIGS. 15A to 15D. FIGS. 15A to 15D illustrate package-on-package (POP) structures using semiconductor packages according to embodiments.

Figure 15A:
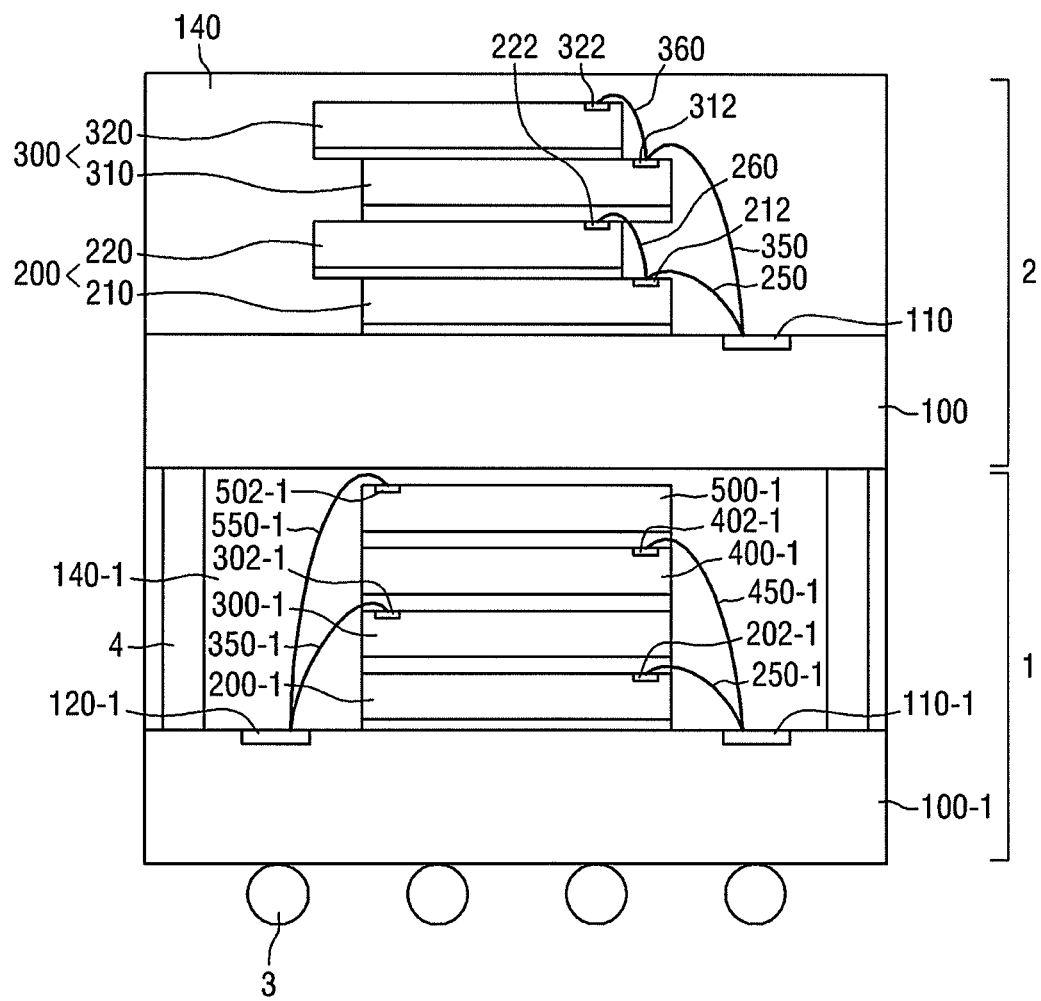
FIGS. 15A to 15D illustrate package-on-package structures using semiconductor packages according to embodiments.

Referring to FIG. 15A, an upper semiconductor package 2 may correspond to the semiconductor package 12 shown in FIG. 2, which is surrounded by an upper molding member 140 and a lower semiconductor package 1 may correspond to the semiconductor package 18 shown in FIG. 18, which is surrounded by a lower molding member 140-1. The upper molding member 140 and the lower molding member 140-1 may be made of, e.g., an epoxy molding compound (EMC). A mounting board 100 of the upper semiconductor package 2 and a mounting board 100-1 of the lower semiconductor package 1 may be electrically connected by a conductive connecting part 4. The conductive connecting part 4 may include, e.g., a solder material. An external terminal 3 that can be electrically connected to an external device may be attached to the other surface corresponding to one surface of the mounting board 100-1 of the lower semiconductor package 1. The semiconductor package 12 shown in FIG. 5B may be included in the lower semiconductor package 1 and the semiconductor package 18 shown in FIG. 11 may be included in the upper semiconductor package 2.

Figure 15B:
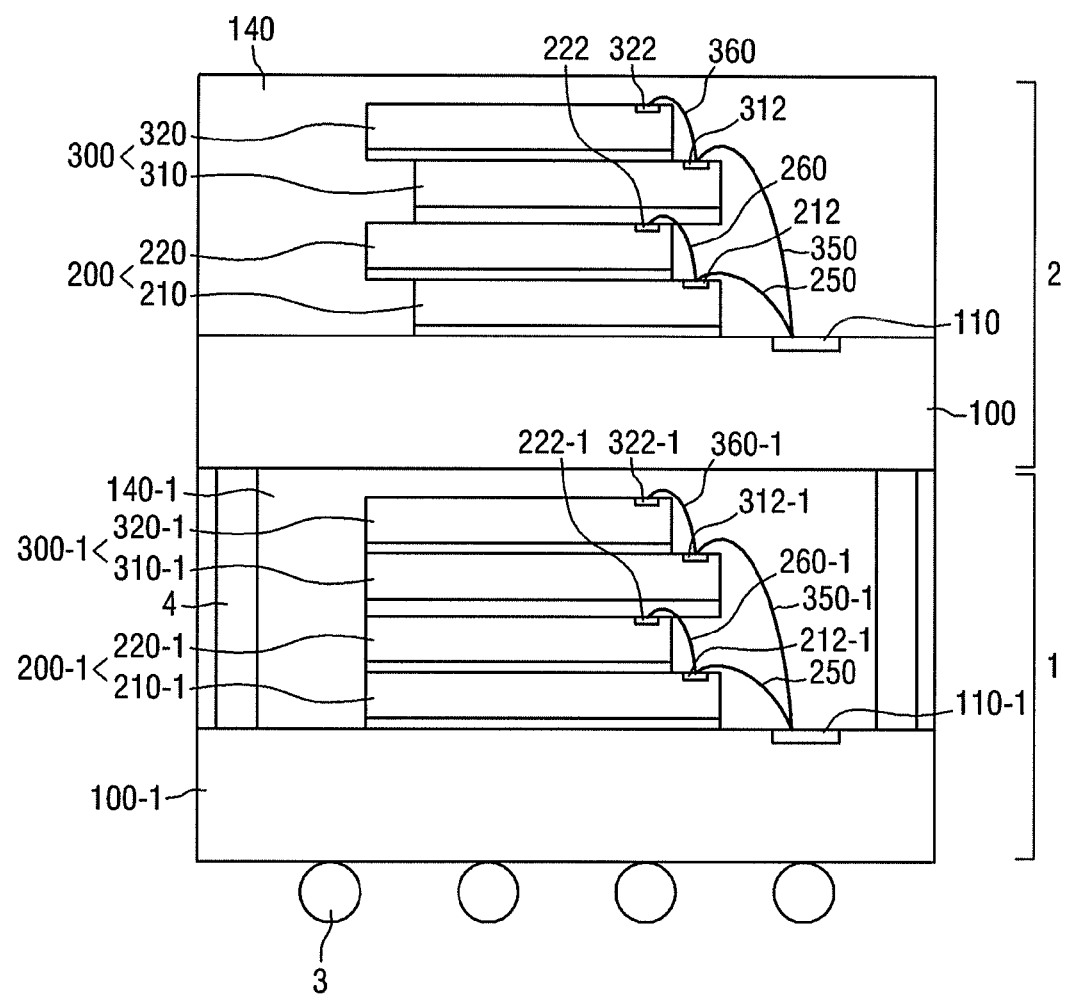

Referring to FIG. 15B, the POP structure may be a package-on-package having the upper semiconductor package 2 and the lower semiconductor package 1 using the semiconductor package 12 shown in FIG. 5B stacked vertically. The POP structure shown in FIG. 15B is different from the POP structure shown in FIG. 15A in that the same number of bonding pads are included in the semiconductor package used for the lower semiconductor package 1 and the upper semiconductor package 2.

Figure 15C:
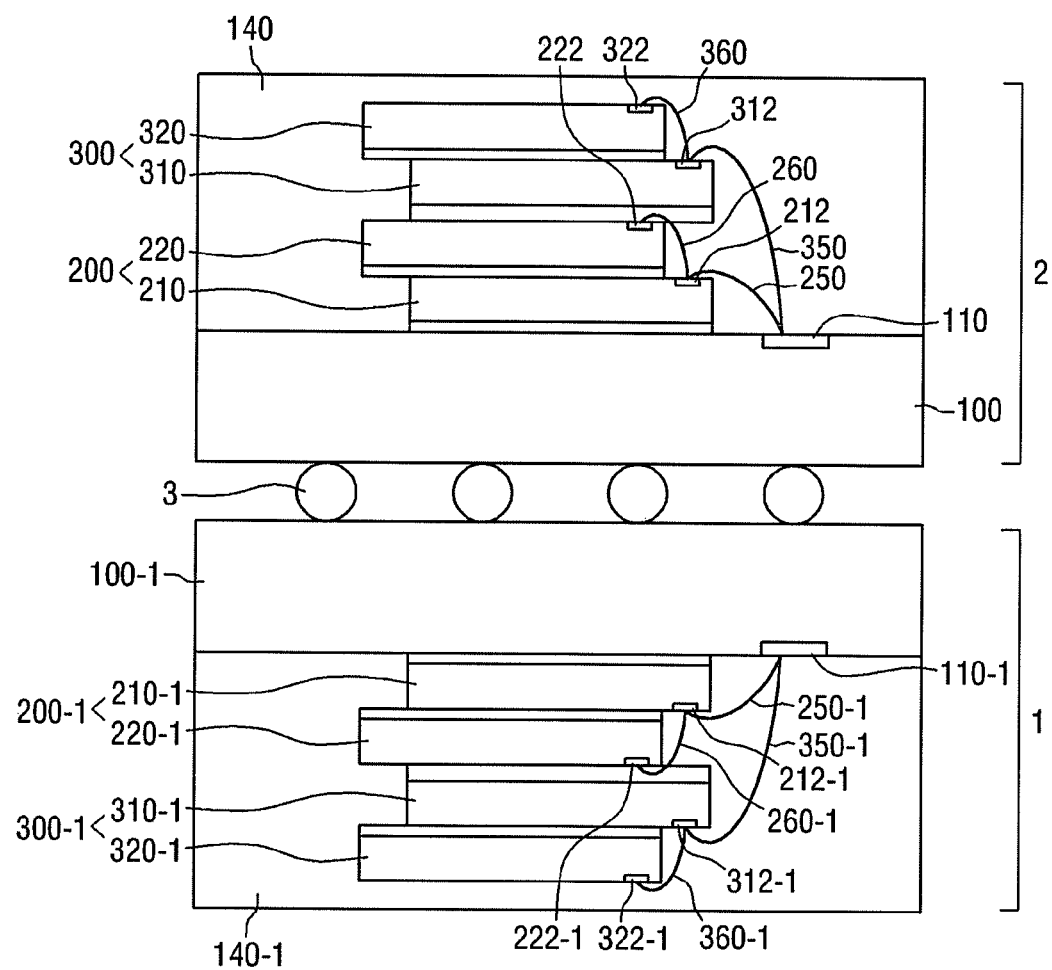

Referring to FIG. 15C, the POP structure may be a package-on-package having the upper semiconductor package 2 and the lower semiconductor package 1 using the semiconductor package 12 shown in FIG. 5B stacked in a mirrored manner. The POP structure shown in FIG. 15C is different from the POP structure shown in FIG. 15B in that the upper and lower semiconductor packages are stacked in different directions.

Figure 15D:
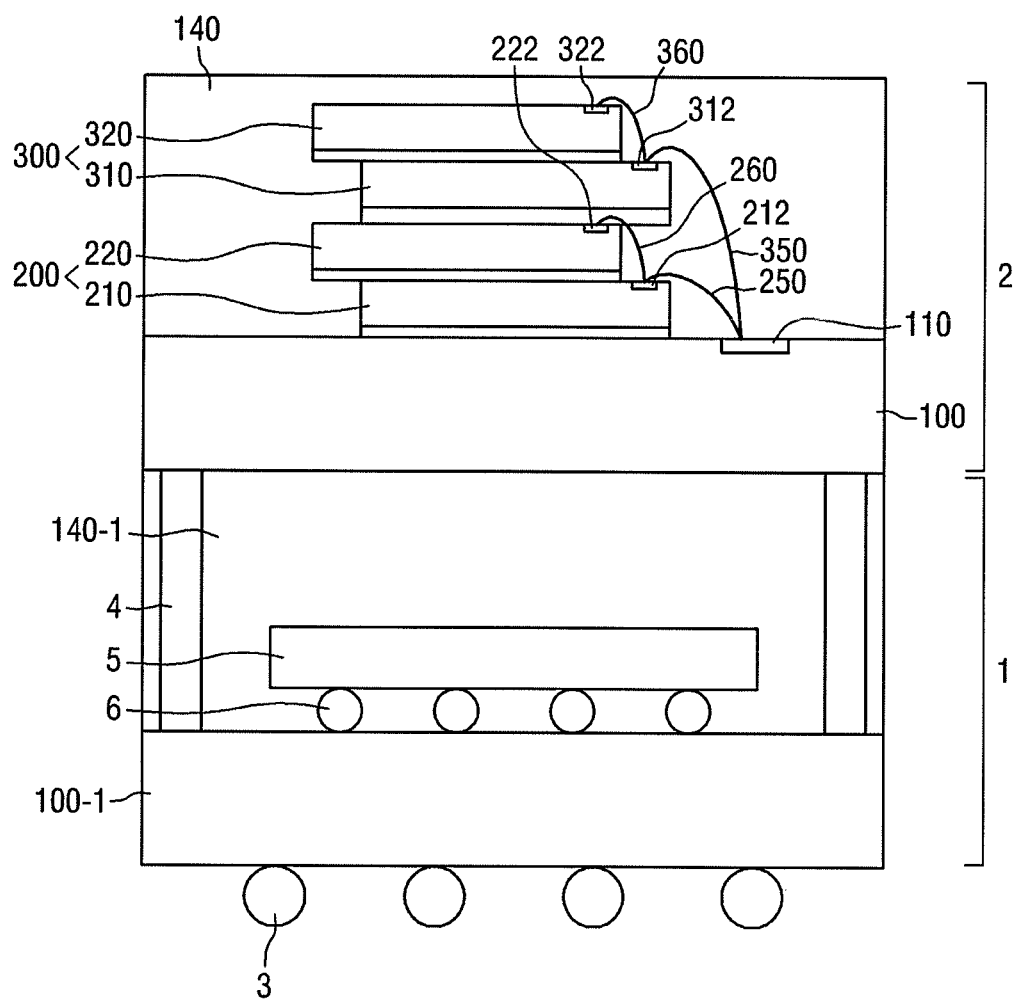

Referring to FIG. 15D, the upper semiconductor package 2 using the semiconductor package 12 shown in FIG. 5B may be disposed on the lower semiconductor package 1 having the semiconductor chip 5 without double wire bonding. In the illustrated embodiment, the semiconductor chip 5 is connected to the mounting board of the lower semiconductor package by a solder ball 6, but aspects of the example embodiments are not limited thereto.

Figure 16:
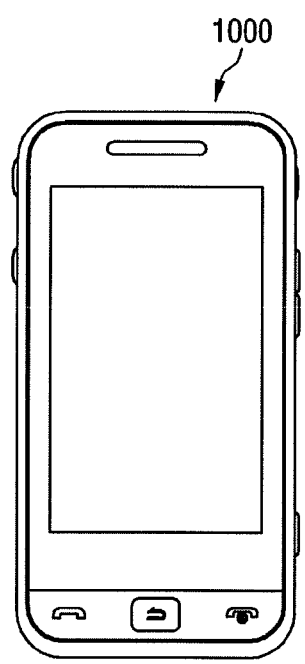
FIG. 16 illustrates a perspective view of an electronic device including a semiconductor package according to embodiments.

FIG. 16 is a perspective view of an electronic device including a semiconductor package according to embodiments.

Referring to FIG. 16, the semiconductor package according to embodiments may be applied to an electronic device 1000, such as a cellular phone. Since the semiconductor package according to embodiments of the example embodiments is highly reliable, the operating reliability of the electronic device 1000 can be ensured even under harsh conditions. The electronic device 1000 is not limited to the cellular phone shown in FIG. 16, and examples thereof may include a variety of electronic devices, such as a mobile electronic device, a notebook computer, a portable multimedia player (PMP), an MP3 player, a camcorder, a memory stick, or a memory card.

A method for fabricating a semiconductor package according to an embodiment will be described with reference to FIGS. 17A to 17D. In the following description, the semiconductor package according to the example embodiments will be described with regard to the semiconductor package shown in FIG. 10B.

FIGS. 17A to 17D illustrate a method for fabricating a semiconductor package according to an embodiment.

Figure 17A:
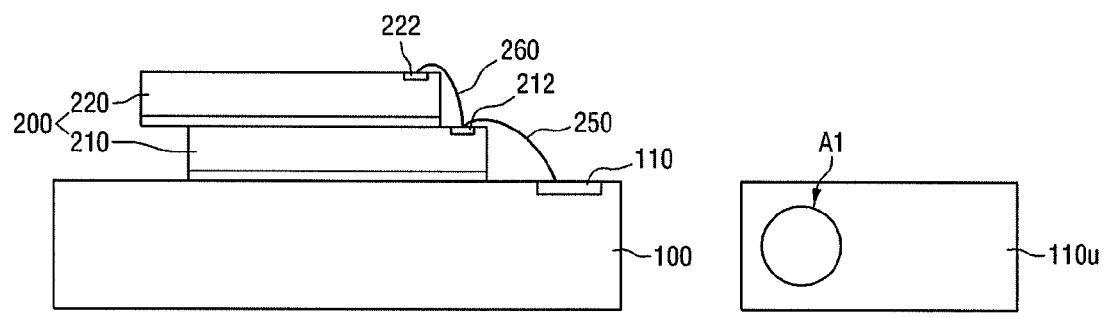
FIGS. 17A to 17D illustrate a method for fabricating a semiconductor package according to an embodiment.

Referring to FIG. 17A, a first semiconductor chip 200 is disposed on a mounting board 100 including a first bonding pad 110 The first semiconductor chip 200 may be single chip, but may also include a plurality of chips. The first semiconductor chip 200 may include a first lower semiconductor chip 210 and a second upper semiconductor chip 320. Here, the first lower semiconductor chip 210 and the first upper semiconductor chip 220 may be sequentially stacked on the mounting board 100.

A chip pad of the first semiconductor chip 200 and the first bonding pad 110 may be wire bonded by a first wire 250. The first wire 250 may be bonded to the first bonding pad 110 in a second region A2. Referring to FIG. 17A, a chip pad 222 of the first upper semiconductor chip 220 and a chip pad 212 of the first lower semiconductor chip 210 may be connected by a first inter-chip wire 260, and the chip pad 212 of the first lower semiconductor chip 210 and a first region A1 of the first bonding pad 110 may be connected by a first wire 250. The first wire 250 and the first inter-chip wire 260 may be formed in any arbitrary order. For example, the chip pad 222 of the first upper semiconductor chip 220 and the chip pad 212 of the first lower semiconductor chip 210 may first be connected by the first inter-chip wire 260, and the chip pad 212 of the first lower semiconductor chip 210 and the first region A1 of the first bonding pad 110 may then by connected by the first wire 250.

Figure 17B:
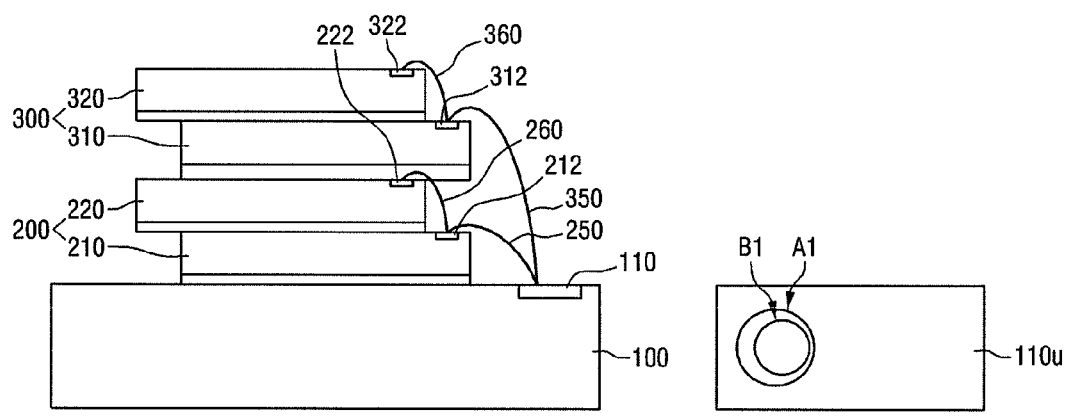

Referring to FIG. 17B, a second semiconductor chip 300 may be stacked on the first semiconductor chip 200. In a case where the second semiconductor chip 300 includes a second lower semiconductor chip 310 and a second upper semiconductor chip 320, the second lower semiconductor chip 310 and the second upper semiconductor chip 320 may be sequentially stacked on the first upper semiconductor chip 220.

A chip pad of the second semiconductor chip 300 and the first region A1 of the first bonding pad 110 may be wired by a second wire 350. Since a reverse wiring method is used for wiring to form the second wire 350, the second wire 350 is a reverse loop wire. Since the second wire 350 is boned to the first bonding pad 110 on the first region A1 of the first bonding pad 110, the first wire 250 and the second wire 350 establish double bonding on the first region A1. The second wire 350 is bonded to the first bonding pad 110 at a region B1.

Referring again to FIG. 17B, a chip pad 322 of the second upper semiconductor chip 320 and a chip pad 312 of the second lower semiconductor chip 310 are connected by a second inter-chip wire 360, and the chip pad 312 of the second lower semiconductor chip 310 and the first region A1 of the first bonding pad 110 are connected by the second wire 350. In the illustrated embodiment, the second wire 350 connecting the chip pad 312 of the second lower semiconductor chip 310 and the first region A1 of the first bonding pad 110 is formed by reverse wiring. However, the formation of the second inter-chip wire 360 may start at any location. In addition, the second inter-chip wire 360 and the second wire 350 may be formed in any arbitrary order. For example, the first region A1 of the first bonding pad 110 and the chip pad 312 of the second lower semiconductor chip 310 may first be connected by the second wire 350, and the chip pad 312 of the second lower semiconductor chip 310 and chip pad 322 of the second upper semiconductor chip 320 may then be connected by the second inter-chip wire 360.

Figure 17C:
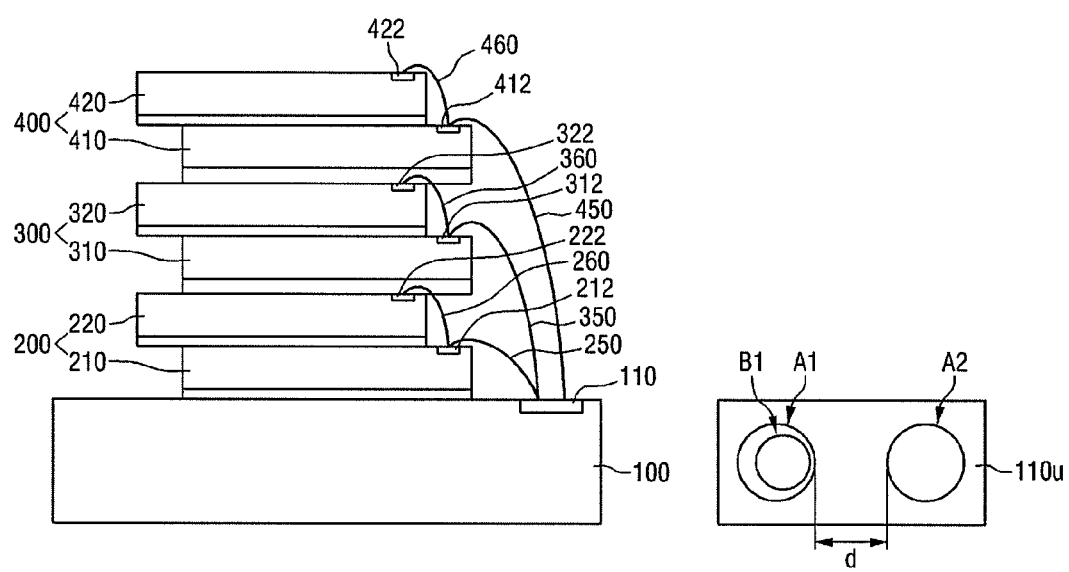

Referring to FIG. 17C, a third semiconductor chip 400 may be stacked on the second semiconductor chip 300. In a case where the third semiconductor chip 400 includes a third lower semiconductor chip 410 and a third upper semiconductor chip 420, the third lower semiconductor chip 410 and the third upper semiconductor chip 420 may be sequentially stacked on the second upper semiconductor chip 320.

A chip pad of the third semiconductor chip 400 and the second region A2 of the first bonding pad 110 may be wired by a third wire 450. The third wire 450 may be bonded to the first bonding pad 110 at the second region A2. Referring to FIG. 17C, a chip pad 422 of the third upper semiconductor chip 420 and a chip pad 412 of the first lower semiconductor chip 410 may be connected by a third inter-chip wire 460, and the chip pad 412 of the third lower semiconductor chip 410 and a second region A2 of the first bonding pad 110 may be connected by a third wire 450. The third wire 450 and the third inter-chip wire 460 may be formed in any arbitrary order. For example, the chip pad 422 of the third upper semiconductor chip 420 and the chip pad 412 of the third lower semiconductor chip 410 may first be connected by the third inter-chip wire 460, and the chip pad 412 of the third lower semiconductor chip 410 and the second region A2 of the first bonding pad 110 may then by connected by the third wire 450.

Figure 17D:
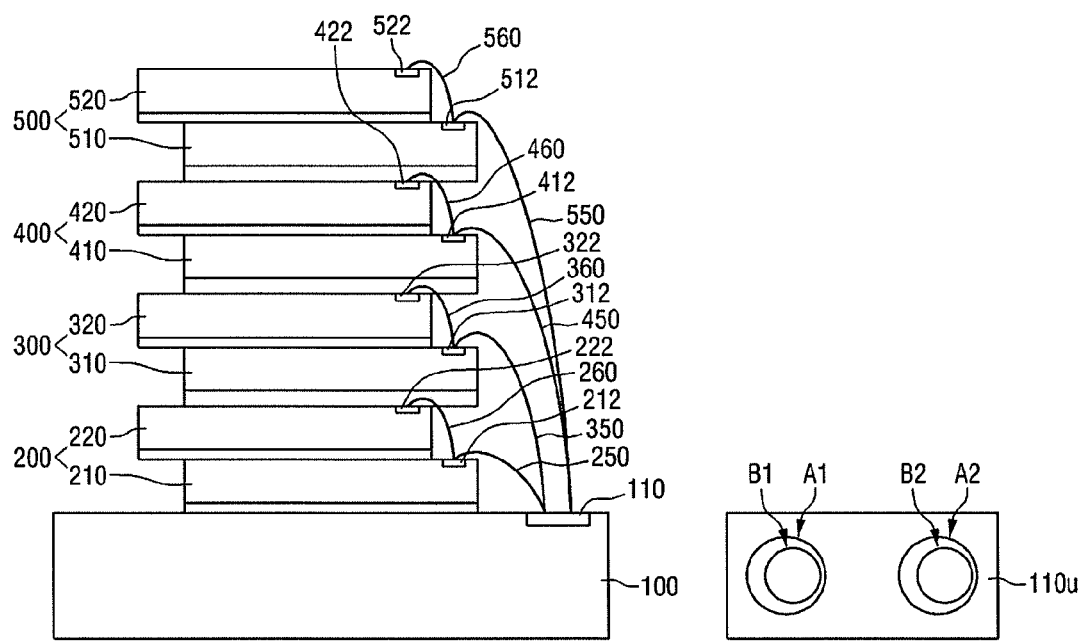

Referring to FIG. 17D, a fourth semiconductor chip 500 may be stacked on the third semiconductor chip 400. In a case where the fourth semiconductor chip 500 includes a fourth lower semiconductor chip 510 and a fourth upper semiconductor chip 520, the fourth lower semiconductor chip 510 and the fourth upper semiconductor chip 520 may be sequentially stacked on the third upper semiconductor chip 420.

A chip pad of the fourth semiconductor chip 500 and the second region A2 of the first bonding pad 110 may be wired by a fourth wire 550. Since a reverse wiring method is used for wiring to form the fourth wire 550, the third wire 450 and the fourth wire 550 establish double bonding on the first region A1.

Referring again to FIG. 17D, a chip pad 522 of the fourth semiconductor chip 500 and a chip pad 512 of the fourth lower semiconductor chip 510 are connected by a fourth inter-chip wire 560, and the chip pad 512 of the fourth lower semiconductor chip 510 and the second region A2 of the first bonding pad 110 are connected by the fourth wire 550. In the illustrated embodiment, the second wire 350 connecting the chip pad 312 of the second lower semiconductor chip 310 and the first region A1 of the first bonding pad 110 is formed by reverse wiring. However, the formation of the second inter-chip wire 360 may start at any location. In addition, the second inter-chip wire 360 and the second wire 350 may be formed in any arbitrary order. For example, the fourth inter-chip wire 560 may be formed after forming the fourth wire 550.

By way of summary and review, according to example embodiments, a semiconductor package may include a plurality of semiconductor chips electrically connected to a bonding pad, such that wires of different semiconductor chips may be double bonded to the bonding pad. In other words, connection regions of the different wires on the bonding pad may at least partially overlap. Therefore, the area of the bonding pad contacted by the wires is reduced, so that the size of the semiconductor package may be reduced as well. In contrast, when each semiconductor chip of a conventional semiconductor package is connected by a separate wire to a different region of a bonding pad, a width of bonding pad may increase, thereby increasing the size of the semiconductor package is also increased.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the example embodiments as set forth in the following claims.

What is claimed is:

1. A semiconductor package, comprising:
   a mounting board including a bonding pad;
   first and second semiconductor chips sequentially stacked on the mounting board;
   a first wire connecting a first region of the bonding pad to a chip pad of the first semiconductor chip; and
   a second wire connecting the first region of the bonding pad to a chip pad of the second semiconductor chip, the second wire having a reverse loop configuration,
   wherein the first semiconductor chip includes a first upper semiconductor chip and a first lower semiconductor chip, and the first wire connects a chip pad of the first lower semiconductor chip to the bonding pad.

2. The semiconductor package as claimed in claim 1, wherein the first wire is connected to the bonding pad in a stitch configuration and the second wire is connected to the bonding pad in a ball bonding configuration.

3. The semiconductor package as claimed in claim 1, further comprising a bump ball between the first wire and the second wire on the first region.

4. The semiconductor package as claimed in claim 1, wherein at least a portion of the second wire overlaps the first region.

5. The semiconductor package as claimed in claim 1, wherein the second semiconductor chip includes a second upper semiconductor chip and a second lower semiconductor chip, and the second wire connects a chip pad of the second lower semiconductor chip to the bonding pad.

6. The semiconductor package as claimed in claim 5, further comprising a third wire connecting the chip pad of the first lower semiconductor chip to a chip pad of the first upper semiconductor chip, and a fourth wire connecting the chip pad of the second lower semiconductor chip to a chip pad of the second upper semiconductor chip.

7. The semiconductor package as claimed in claim 1, further comprising:
   third and fourth semiconductor chips sequentially stacked on the second semiconductor chip, and
   third and fourth wires connecting the bonding pad to chip pads of the third and fourth semiconductor chips, respectively,
   wherein the third wire is bonded to the bonding pad in a second region of the bonding pad, and the fourth wire is bonded to the second region having the third wire bonded thereto and has a reverse loop configuration.

8. The semiconductor package as claimed in claim 7, wherein the third semiconductor chip includes a third upper semiconductor chip and a third lower semiconductor chip, the third wire connecting a chip pad of the third lower semiconductor chip to the bonding pad.

9. The semiconductor package as claimed in claim 8, wherein the fourth semiconductor chip includes a fourth upper semiconductor chip and a fourth lower semiconductor chip, the fourth wire connecting a chip pad of the fourth lower semiconductor chip to the bonding pad.

10. The semiconductor package as claimed in claim 9, further comprising:
    a fifth wire connecting the chip pad of the third lower semiconductor chip to a chip pad of the third upper semiconductor chip, and
    a sixth wire connecting the chip pad of the fourth lower semiconductor chip to a chip pad of the fourth upper semiconductor chip.

11. A semiconductor package, comprising:
a mounting board including a first bonding pad and a second bonding pad spaced apart from each other;
first to fourth semiconductor chips sequentially stacked between the first and second bonding pads and including first to fourth chip pads, respectively;
a first wire connecting a first region of the first bonding pad to the first chip pad;
a second wire connecting a second region of the second bonding pad to the second chip pad;
a third wire connecting the first region having the first wire bonded thereto to the third chip pad, the third wire having a reverse loop configuration; and
a fourth wire connecting the second region having the second wire bonded thereto to the fourth chip pad, the fourth wire having a reverse loop configuration.

12. The semiconductor package as claimed in claim 11, further comprising a bump ball on at least one of a portion between the first wire and the third wire on the first region, and a portion between the second wire and the fourth wire on the second region.

13. The semiconductor package as claimed in claim 11, wherein the first and second wires are connected to the first and second bonding pads in a stitch configuration, respectively, the third and fourth wires being connected to the first and second bonding pads in a ball bonding configuration, respectively.

14. The semiconductor package as claimed in claim 11, further comprising fifth to eighth semiconductor chips sequentially stacked on the fourth semiconductor chip and including fifth to eighth chip pads,
wherein a third region of the first bonding pad is connected to the fifth chip pad by a fifth wire, a fourth region of the second bonding pad is connected to the sixth chip pad by a sixth wire, the third region having the fifth wire bonded thereto is connected to a seventh chip pad by a seventh wire having a reverse loop configuration, and the fourth region having the seventh wire bonded thereto is connected to an eighth chip pad by an eighth wire having a reverse loop configuration.

15. A semiconductor package, comprising:
a mounting board including a bonding pad;
first and second semiconductor chips sequentially stacked on the mounting board;
a first wire connecting a first region of the bonding pad to a chip pad of the first semiconductor chip; and
a second wire connecting the first region of the bonding pad to a chip pad of the second semiconductor chip, the second wire being connected to the first region through the first wire,
wherein the first wire defines a first connection region in the first region of the bonding pad, the second wire defines a second connection region in the first region of the bonding pad, the first and second connection regions at least partially overlap each other, and centers of the first and second connection regions do not overlap.

16. The semiconductor package as claimed in claim 15, wherein a portion of the second connection region directly contacts the bonding pad.

17. The semiconductor package as claimed in claim 15, wherein the entire second connection region contacts the bonding pad only through the first connection region.

* * * * *